United States Patent
Laisne et al.

(10) Patent No.: US 11,056,210 B1
(45) Date of Patent: Jul. 6, 2021

(54) ELECTRICAL CIRCUIT COMPRISING A TRIM CIRCUIT

(71) Applicant: Dialog Semiconductor (UK) Limited, London (GB)

(72) Inventors: Michael Laisne, Encitas, CA (US); Vivek Bhan, Saratoga, CA (US); Hans Martin von Staudt, Weilheim (DE)

(73) Assignee: Dialog Semiconductor (UK) Limited, London (GB)

( * ) Notice: Subject to any disclaimer, the term of this patent is extended or adjusted under 35 U.S.C. 154(b) by 16 days.

(21) Appl. No.: 16/789,576

(22) Filed: Feb. 13, 2020

(51) Int. Cl.
  *G11C 7/12*      (2006.01)
  *G11C 29/02*     (2006.01)
  *H01L 27/06*     (2006.01)
  *G11C 16/30*     (2006.01)

(52) U.S. Cl.
  CPC .......... *G11C 29/028* (2013.01); *G11C 16/30* (2013.01); *G11C 29/021* (2013.01); *H01L 27/0676* (2013.01)

(58) Field of Classification Search
  CPC . G11C 29/1201; G11C 11/419; G11C 27/024; G11C 7/1087; G11C 7/109; G11C 29/028; G11C 29/02; G11C 29/023; G11C 7/222; G11C 17/18; G11C 16/26; G11C 11/4076
  See application file for complete search history.

(56) References Cited

U.S. PATENT DOCUMENTS

| | | | |
|---|---|---|---|
| 5,319,370 | A | 6/1994 | Signore et al. |
| 5,550,512 | A | 8/1996 | Fukahori |
| 6,111,471 | A | 8/2000 | Bonneau et al. |
| 6,114,920 | A | 9/2000 | Moon et al. |
| 6,433,714 | B1 | 8/2002 | Clapp et al. |
| 6,504,394 | B2 | 1/2003 | Ohlhoff |
| 6,909,642 | B2 | 6/2005 | Lehmann et al. |
| 6,943,616 | B2 | 9/2005 | Ogawa et al. |
| 7,284,167 | B2 | 10/2007 | Lee et al. |

(Continued)

FOREIGN PATENT DOCUMENTS

JP    2004-179505    6/2004

OTHER PUBLICATIONS

European Search Report, Application No. 09392001.5-2216, Applicant: Dialog Semiconductor GmbH, dated Oct. 16, 2009, 8 pages.

(Continued)

*Primary Examiner* — Hien N Nguyen
(74) *Attorney, Agent, or Firm* — Saile Ackerman LLC; Stephen B. Ackerman

(57) ABSTRACT

A method of producing an apparatus comprising an electrical circuit that has one or more characteristics that meet a design specification is presented. The method includes designing the electrical circuit with a trim circuit having a trim value that is variable, The electrical circuit is adjustable based on the trim value of the trim circuit. There is encoding of the functional circuit information and/or trim circuit information in a tag, The method has a reading of the functional circuit information and/or the trim circuit information stored in the tag and the determining of the trim value for the trim circuit that results in the characteristic of the electrical circuit meeting the design specification using the functional circuit information and/or the trim circuit information.

27 Claims, 17 Drawing Sheets

(56) References Cited

U.S. PATENT DOCUMENTS

| | | | |
|---|---|---|---|
| 7,352,230 | B2 | 4/2008 | An |
| 9,672,878 | B1* | 6/2017 | de Cremoux .......... G11C 5/141 |
| 2001/0004126 | A1 | 6/2001 | Ohlhoff |
| 2006/0274594 | A1* | 12/2006 | Huckaby .............. G11C 29/021 |
| | | | 365/226 |
| 2006/0276986 | A1 | 12/2006 | Anderson et al. |
| 2007/0133319 | A1 | 6/2007 | Noichi |
| 2008/0012596 | A1 | 1/2008 | Lewison et al. |
| 2010/0289590 | A1 | 11/2010 | von Staudt et al. |

OTHER PUBLICATIONS

"Improved Path Clustering for Adaptive Path-Delay Testing," by Tuck-Boon Chan et al., Thirteenth International Symposium on Quality Electronic Design (ISQED), Mar. 19-21, 2012, pp. 8 pages.
Ken Butler, Keynote Address: Realizing the Benefits of Adaptive Test; 2010 BiTS Workshop, Mar. 7-10, 2010, pp. 1-11.
"Wafer Probe Test Cost Reduction of an RF/A Device by Automatic Testset Minimization—a Case Study13 ," by Dragoljub (GAGI) Drmanac et al., Paper 6.2, Internatioan Test Conference, Copyright 2011 IEEE, pp. 1-10.

* cited by examiner

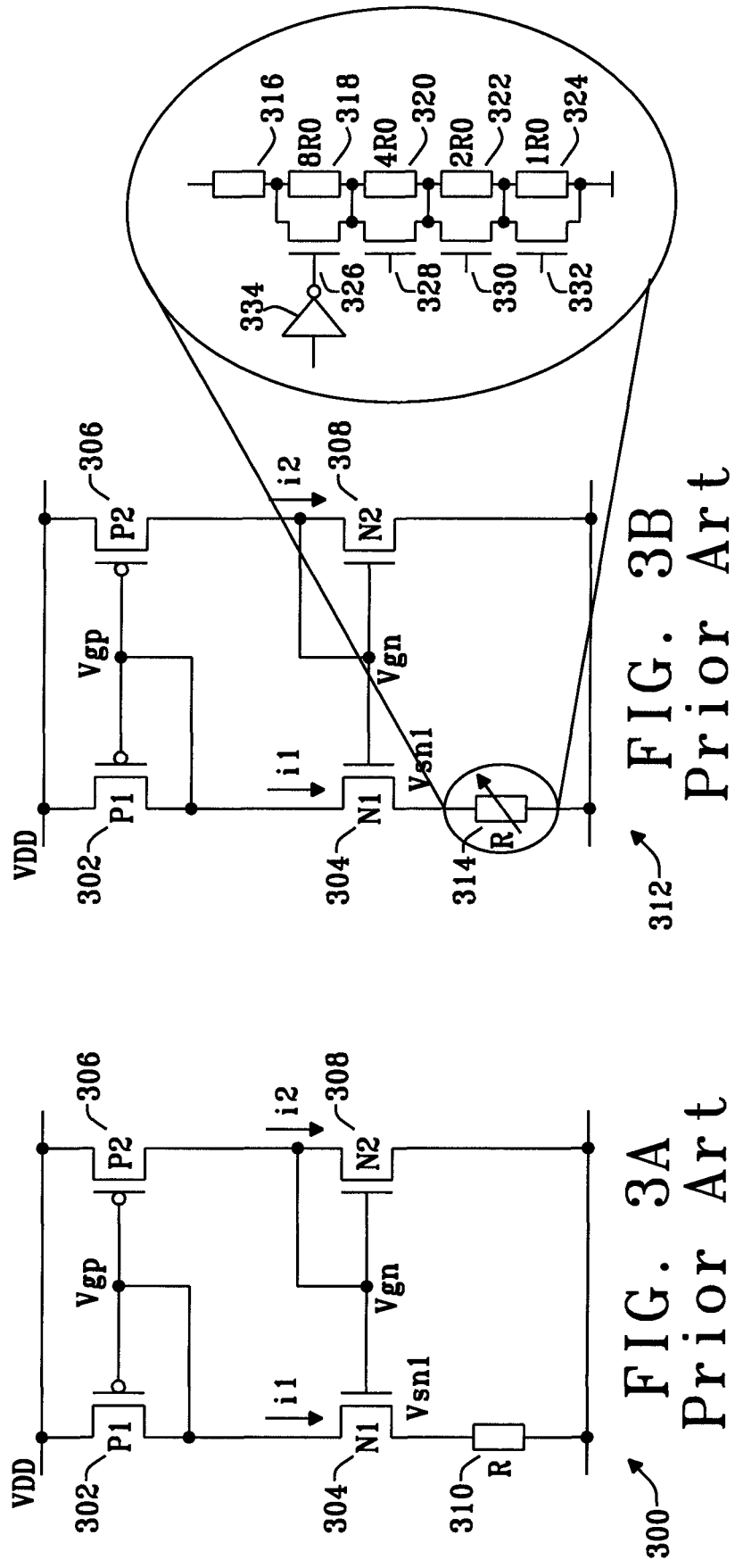

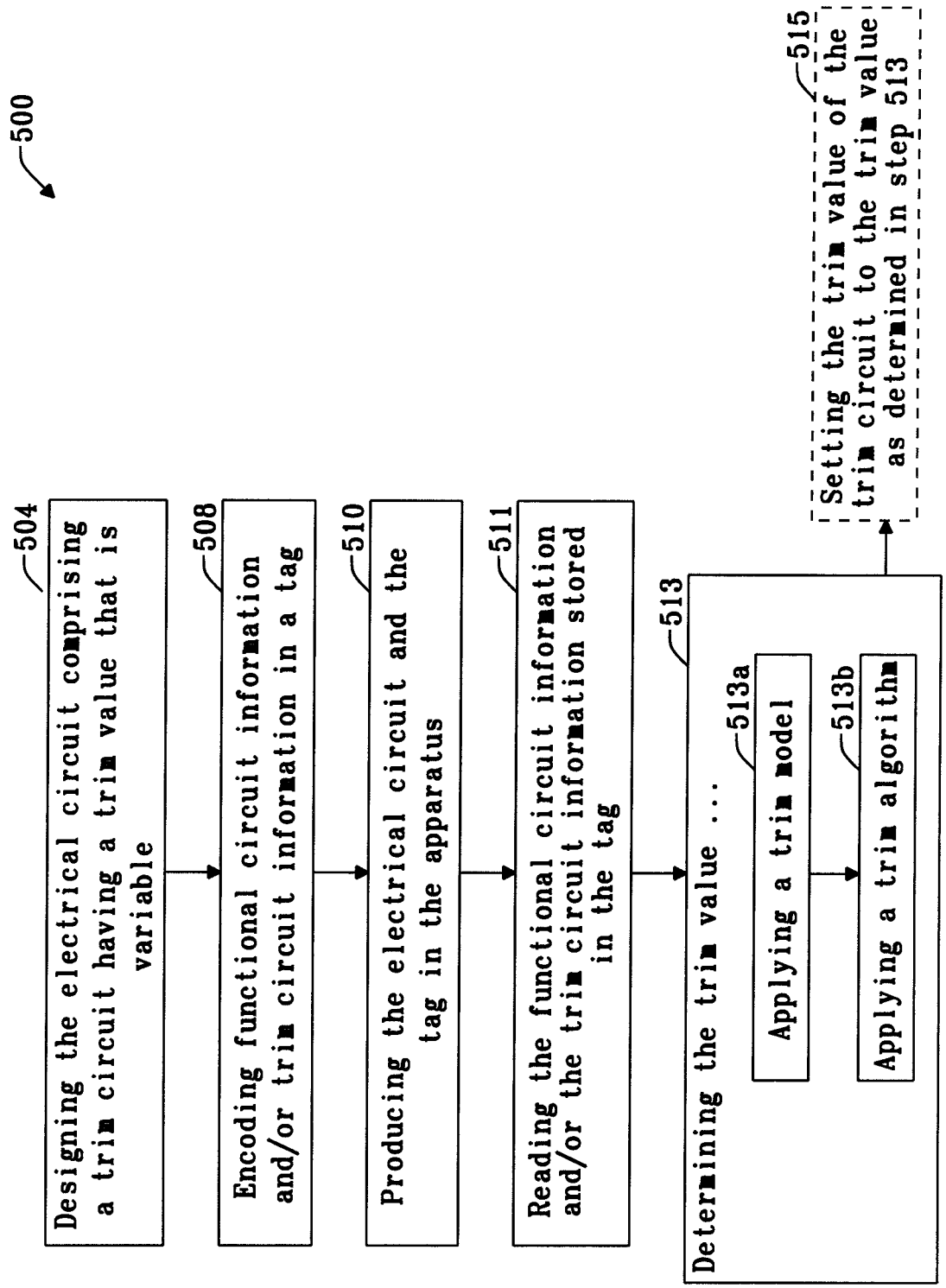

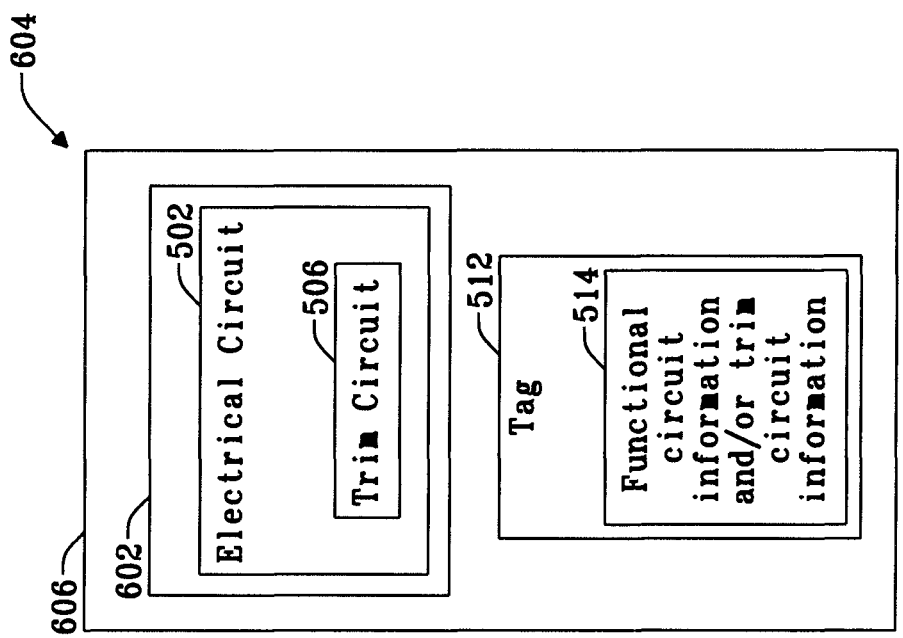

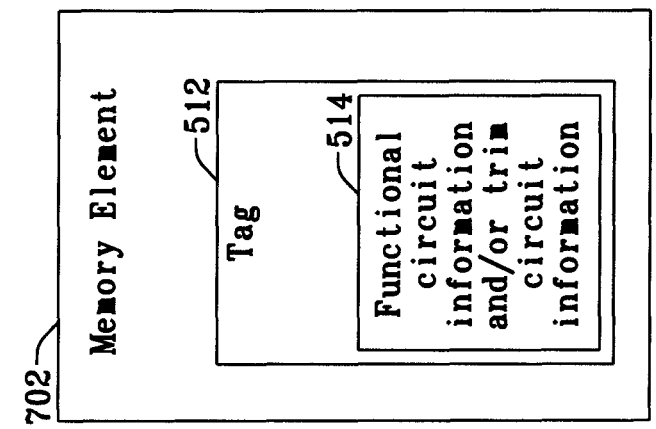
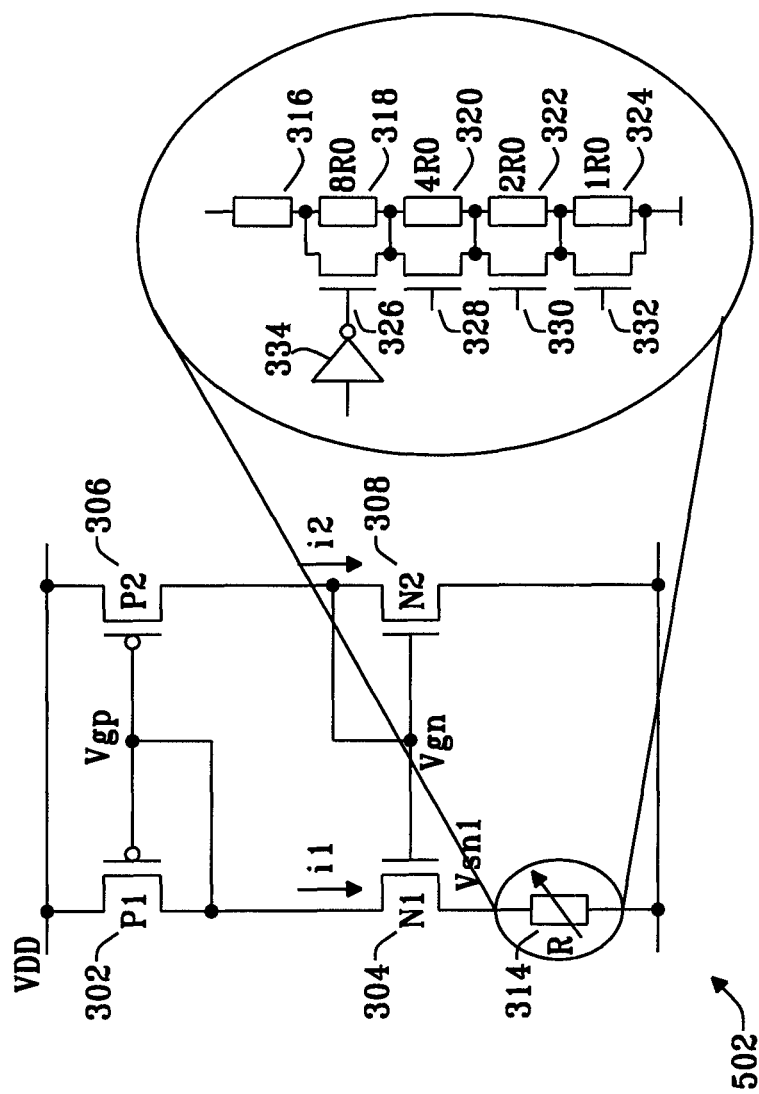
FIG. 12

ELECTRICAL CIRCUIT COMPRISING A TRIM CIRCUIT

The present disclosure relates to a method of producing an electrical circuit that meets a design specification. In particular the present disclosure relates to producing an electrical circuit comprising a trim circuit that has an associated tag comprising functional circuit information and/or trim circuit information for determining a trim value for the trim circuit, where determining the trim value comprises a step of applying a trim model.

BACKGROUND

Patent application: US20100289590A1 is hereby included in the present application by reference.

FIG. 1 is a flow chart 100 showing a process flow for producing an electrical circuit comprising a trim circuit in accordance with the prior art. Typically, the first step of the process is process selection, as shown at step 102. Process selection refers to the selection of the electronic design and manufacturing processes that will be used to ultimately produce the electrical circuit. The process may, for example, be characterised by process nodes, which are well understood in the field of semiconductor fabrication. The process selection can influence the type of circuits that can be manufactured, in addition to their characteristics. This can also influence the characteristics of the trim circuit that may be manufactured. Typically, a design specification is determined at this stage which outlines the requirements for the electrical circuit and an appropriate process is selected to meet the design specification.

After selection of the process, the electrical circuit is designed, as shown at step 104. Design may include performing simulations selected from a simulation library available to the selected process. Design may be carried out in circuit design software. During step 104, the circuit designer may perform circuit analysis and simulation to design the electrical circuit to meet the design specification. The electrical circuit may be formed by discrete circuit elements. It is often the case that model parameters used to describe the circuit elements do not accurately represent the physical characteristics of the circuit elements or the variance of their behavior across process corners. Therefore, there is likely to be a mismatch between the properties of the simulated electrical circuit and the electrical circuit that is eventually manufactured into a physical product.

A method to compensate for this mismatch is to include a trim circuit in the electrical circuit. A trim circuit has a variable property, that can be adjusted after manufacture to tune the overall properties of the electrical circuit. This adjustment step is typically referred to as "trimming". In an ideal process, where the model parameters of the circuit elements exactly match their physical properties, there would be no need for trimming. In reality however, the process is non-ideal and some variation between simulated and physical circuit elements will occur.

The variations in circuit element parameters may be permanent, changing only once or a few times in the product life cycle. Additionally, the variations may change, for example, from lot to lot, from wafer to wafer, from reticle to reticle, from device to device, or may differ between similar structures within a single device.

In summary, in a practical circuit, process variations can result in non-ideal elements within the circuit. The use of a trimming circuit can be used to compensate for these variations after manufacture, thereby enabling an electrical circuit to meet its design specification.

Upon completion of the design of the electrical circuit, the electrical circuit as designed is then fabricated at step 106. Prior to fabrication the design may be exported from the design software and provided to a database which converts the exported design file to the appropriate instructions to fabricate the electrical circuit design using semiconductor processing tools. The database may contain the information necessary to fabricate the design.

Typically based on input provided by the circuit designer, the test engineer will choose a default trim setting at step 108 and then apply a trim algorithm 110 to determine an appropriate trim value for the trim circuit. The default trim setting is the starting trim value and may, for example, simply be equal to zero. Alternatively, the default trim setting may be an arbitrary selection of the trim value. The trim algorithm describes the process that is applied to determine a trim value that enables the design specification to be met. The trim algorithm in effect "searches" for the trim value that will provide the desired performance of the electrical circuit.

The trim value, after determined by the trim algorithm, may be stored in a memory element that provides the trim value to the trim circuit as an input when in operation, thereby resulting in the desired electrical circuit performance (as shown in US20100289590A1). It is also known to store the trim algorithm in memory element which can be provided to the trim circuit as an input. The trim algorithm may for example be built in selftest (BIST) code.

Alternatively, in cases where the self-trim is used, selection of the default trim value and the trim algorithm may be done as part of step 104. Finally, characterization is performed at step 112 on a selected number of parts, and, then, following the necessary qualification steps, the device is released to production, where each part is tested with the production test program at the step 114.

Steps 102 and 104 may be carried out by a design engineer and referred to as the design process. Step 106 may be carried out by a semiconductor processing engineer, or may be an automated process, and may be referred to as a fabrication process. Steps 108, 110, 112, 114 may be carried out by a test engineer, and may be referred to as a test process.

FIG. 2 is an illustration showing a standard data flow during production testing of the step 114, as is known in the prior art (Ken Butler; Keynote Address: Realizing the Benefits of Adaptive Test; 2010 BiTS Workshop; Mar. 7-10, 2010).

During production testing, the test engineer will apply an input stimulus, such as an input current, to the electrical circuit being tested. The test engineer will measure an output of the electrical circuit and compare the expected output from the electrical circuit, with the actual measured output. If there is a mismatch between the expected output and the measured output, the test engineer will alter the trim value and repeat the process until the expected output matches the measured output within a suitable tolerance range, as may be presented in a design specification. This procedure may be repeated multiple times for multiple electrical circuits, for example across a single wafer.

The steps carried out by the trim engineer in determining the trim value, and the specific details of these steps, are described by the trim algorithm. For example, the trim algorithm may include information on the size of increment between different trim settings to be tested, and the number of iterations of the trimming process.

FIG. 3A is a schematic of an electrical circuit 300 comprising transistors 302, 304, 306, 308 and a resistor 310 having a resistance R. The value of the resistance R may be subject to process variation that results in the electrical circuit 300 failing to meet the system requirements represented by the design specification, at given corners of the process.

FIG. 3B is a schematic of an electrical circuit 312 corresponding to the electrical circuit 300 but with the inclusion of a trimming circuit 314 that replaces the resistor 310. Common features between Figures are represented by common reference numerals and variables.

In the present example the trimming circuit 314 is a variable resistor comprising a series of resistors 316, 318, 320, 322, 324, four of which are each coupled in parallel to transistors 326, 328, 330, 332. The transistor 326 has a gate coupled to an output of an inverter 334. Each of the resistors 318, 320, 322, 324 has an associated resistance that is an integer multiple of a resistance R0, as shown in the Figure. The overall resistance R' of the trimming circuit 314 can be set by enabling and disabling the transistors 326, 328, 330, 332. The resistance R' of the trimming circuit 314 can therefore be set such that the electrical circuit 300 exhibits the necessary characteristics to meet the design specification.

In this example, and with reference to the production testing of step 114, the test engineer may apply a current i1 to the electrical circuit 300 and measure a current i2. The current i2 may be compared to the expected value of the current i2, and the trimming circuit 314 adjusted until these expected and measured values of the current i2 are suitably close to each other, and preferably are equal. As discussed previously, the details of the steps carried out by the test engineer may be provided by a trim algorithm. In the present example, the trim algorithm may be said to comprise the steps of applying the current i1; measuring the current i2; adjusting the trim value; and repeating until the expected value and measured value of the current i2 are suitably close to each other.

The relationship between the currents i1, i2 is dependent on various aspects of the electrical circuit 300. For example, if transistors 302, 306 are identical and transistors 304, 308 are identical then the currents i1, i2 should be equal. In this example, the test engineer will adjust the trim value of the trim circuit 314 until the currents are i1, i2 are equal.

The trim value used to provide equal currents i1, i2 may then be stored in a memory element and used to "set" the trim value of the trim circuit thereby providing the desired performance.

Depending on the type of electrical circuit, different types of trim algorithms with default trim settings may be applied.

FIG. 3C is a flow diagram providing a general overview of the process of determining the trim value. A default trim value 301 and a trim algorithm 303 are used to determine the trim value 305. FIG. 3D is a flow diagram providing a general overview of the process of setting the trim value 305 upon completion of the determination process. The trim value 305 is used for a trim circuit 307 which provides the required electrical circuit functionality represented by a function circuit 309.

FIG. 3E is a schematic of an electrical circuit 334 comprising a trim circuit 336. The electrical circuit 334 comprises current sources 338, 340, 342, 344, 346, 348 and switches 350, 352, 354, 356.

FIG. 3F is a schematic of an electrical circuit 362 comprising a trim circuit 364. The electrical circuit 362 comprises a current source 365, transistors 366, 368, 370, 372, 374, 375, 377 and switches 376, 378, 380, 382.

Each of the electrical circuits 312, 334, 362 demonstrate ways in which the topology of the target circuit can impact the type of trim circuit that is applied.

Determining a suitable trim value to ensure that the electrical circuit meets the design specification can be a lengthy and costly procedure, as the test engineer typically must rely on manual testing and experience to determine the required trim value.

The process shown by the flow chart 100 may be sped up by applying adaptive testing techniques. One form of adaptive testing is multivariate parametric optimization. This was applied to an RF/A device as reported in: D. Drmanac, M. Laisne and L. C. Wang, "Wafer probe test cost reduction of an RF/A device by automatic testset minimization—A case study," 2011 IEEE International Test Conference(ITC), Anaheim, Calif. USA, 2012, pp. 1-10. This paper demonstrated how significant test time reduction could be achieved. It describes adaptive test a process that modifies test content, test flow, test limits, and test conditions based on test data and statistical analysis of that data.

Another form of adaptive testing minimizes redundant patterns using measured process conditions. This approach is described in: Tuck-Boon Chan, and Andrew B. Kahng, "Improved Path Clustering for Adaptive Path-Delay Testing," Proc. Asia and South Pacific Design Automation Conf., 2013, pp. 527-532; and uses a clustering heuristic. An example of adaptive testing as applied to path delay tests is referenced there and shown in FIG. 4 (Tuck-Boon Chan, and Andrew B. Kahng, "Improved Path Clustering for Adaptive Path-Delay Testing," Proc. Asia and South Pacific Design Automation Conf., 2013, pp. 527-532). These approaches apply to delay fault testing.

These adaptive testing techniques, however, do not apply to trimming and the use of trim circuits and therefore are unsuitable for improving the trimming process.

SUMMARY

It is desirable to provide a method of producing an electrical circuit that meets a design specification that overcomes or mitigates one or more of the above-mentioned problems.

In particular it is desirable to provide a method to enable a test engineer to determine the trim value in a quicker and therefore more cost-effective fashion than prior art methods allow.

According to a first aspect of the disclosure there is provided a method of producing an apparatus comprising an electrical circuit that has one or more characteristics that meet a design specification, comprising designing the electrical circuit comprising a trim circuit having a trim value that is variable, the, or each, characteristic of the electrical circuit being adjustable based on the trim value of the trim circuit, encoding functional circuit information and/or trim circuit information in a tag, producing the electrical circuit and the tag in the apparatus, reading the functional circuit information and/or the trim circuit information stored in the tag, and determining the trim value for the trim circuit that results in the, or each, characteristic of the electrical circuit meeting the design specification using the functional circuit information and/or the trim circuit information, wherein determining the trim value comprises applying a trim model.

Optionally, the trim circuit information comprises the trim model.

Optionally, applying the trim model comprises providing the functional circuit information and/or the trim circuit information to the trim model.

Optionally, the trim circuit information comprises an identifier for the trim circuit.

Optionally, the method comprises identifying the trim circuit by the identifier; wherein determining the trim value comprises i) accessing a database, ii) using the identifier to find database information on the trim circuit in the database, and iii) determining the trim value using the database information.

Optionally, the database information comprises the trim model.

Optionally, applying the trim model comprises providing the database information to the trim model.

Optionally, determining the trim value comprises providing the trim value as an output from the trim model.

Optionally, determining the trim value comprises applying a trim algorithm.

Optionally, the trim algorithm is applied by automated test equipment.

Optionally, determining the trim value comprises providing a default trim setting as an output from the trim model, and using the default trim setting as a starting trim value for the trim circuit in application of the trim algorithm, an output of the trim algorithm being the trim value.

Optionally, the method comprises selecting the trim algorithm that is applied based on an output of the trim model, an output of the trim algorithm being the trim value.

Optionally, the method comprises setting one or more parameters of the trim algorithm based on an output of the trim model, an output of the trim algorithm being the trim value.

Optionally, designing the electrical circuit comprises generating a design file using circuit design software.

Optionally, prior to fabricating the electrical circuit, the design file is passed to a fabrication database comprising information on how to fabricate the electrical circuit.

Optionally, the functional circuit information and/or the trim circuit information comprises at least a portion of the design file.

Optionally, the method comprises setting the trim value of the trim circuit to the trim value, as determined.

Optionally, producing the tag comprises fabricating the tag in a first substrate.

Optionally, producing the electrical circuit comprises fabricating the electrical circuit in the first substrate or a second substrate.

Optionally, producing the tag comprises marking a first electronic package with the tag.

Optionally, producing the electrical circuit comprises fabricating the electrical circuit in a first substrate, and packaging the first substrate in the first electronic package or packaging the first substrate in a second electronic package.

Optionally, producing the tag comprises storing the tag in a memory element.

Optionally, the method comprises fabricating the memory element in a first substrate prior to storing the tag in the memory element.

Optionally, the method comprises producing the electrical circuit comprises fabricating the electrical circuit in the first substrate or fabricating the electrical circuit in a second substrate.

Optionally, the method comprises updating the functional circuit information and/or the trim circuit information stored in the tag.

Optionally, the functional circuit information and/or the trim circuit information stored in the tag is updated using data determined from wafer acceptance test results.

According to a second aspect of the disclosure there is provided an apparatus comprising a first electrical circuit that has one or more characteristics, the first electrical circuit comprising a first trim circuit having a first trim value that is variable, the, or each, characteristic of the first electrical circuit being adjustable based on the first trim value of the first trim circuit, and a first tag comprising first functional circuit information and/or first trim circuit information, the first functional circuit information and/or the trim circuit information being encoded in the first tag, wherein the first functional circuit information and/or the first trim circuit information stored in the first tag is configured to be readable, and the first functional circuit information and/or the first trim circuit information is suitable for determining the first trim value for the first trim circuit that results in the, or each, characteristics of the first electrical circuit meeting a first design specification, and determining the first trim value comprises applying a first trim model.

Optionally, the apparatus comprises a first substrate, wherein the first tag is fabricated in the first substrate.

Optionally, the apparatus comprises the first electrical circuit is fabricated in the first substrate.

Optionally, the apparatus comprises a second substrate, wherein the first electrical circuit is fabricated in the second substrate.

Optionally, the apparatus comprises a first electronic package, wherein the first electronic package is marked with the first tag.

Optionally, the apparatus comprises a first substrate wherein the first electrical circuit is fabricated in the first substrate and the first substrate is packaged in the first electronic package.

Optionally, the apparatus comprises a first substrate and a second electronic package, wherein the first electrical circuit is fabricated in the first substrate and the first substrate is packaged in the second electronic package.

Optionally, the apparatus comprises a first memory element, wherein the first tag is stored in the first memory element.

Optionally, the apparatus comprises a first substrate, wherein the memory element is fabricated in the first substrate.

Optionally, the first electrical circuit is fabricated in the first substrate.

Optionally, the first substrate is packaged in a first electronic package.

Optionally, the second substrate is packaged in a second electronic package.

Optionally, the first substrate and the second substrate are packaged in a first electronic package.

Optionally, the trim circuit information comprises an identifier for the trim circuit.

Optionally, the trim circuit information comprises an identifier for a trim model.

Optionally, the trim circuit information comprises a trim model, and the trim value is determined using the trim model.

Optionally, the tag is configured to be updatable.

Optionally, the apparatus comprises a second electrical circuit that has one or more characteristics, the second electrical circuit comprising a second trim circuit having a second trim value that is variable, the, or each, characteristic of the second electrical circuit being adjustable based on the second trim value of the second trim circuit, and a second tag comprising second functional circuit information and/or second trim circuit information, the second functional circuit information and/or the second trim circuit information being encoded in the second tag, wherein the second functional circuit information and/or the second trim circuit information stored in the second tag is configured to be readable, and the second functional circuit information and/or the second trim circuit information is suitable for determining the second trim value for the second trim circuit that results in the, or each, characteristic of the second electrical circuit meeting a second design specification, and determining the second trim value comprises applying a second trim model.

Optionally, the first trim model and the second trim model are the same.

Optionally, the first tag and the second tags are suitable for distinguishing between the first trim circuit and the second trim circuit.

Optionally, the apparatus comprises a first substrate, wherein at least one of the first electrical circuit, the first tag, the second electrical circuit and the second tag is fabricated in the first substrate.

Optionally, the apparatus comprises a first electronic package, wherein the first substrate is packaged in the first electronic package.

Optionally, the apparatus comprises a plurality of substrates, wherein each of the first electrical circuit, the first tag, the second electrical circuit and the second tag are fabricated in one of the plurality of substrates.

Optionally, the apparatus comprises one or more electronic packages, where at least one of the plurality of substrates is packaged in one of the one or more electronic packages.

Optionally, the apparatus comprises a first electronic package, wherein the first tag and/or the second tag are marked on the electronic package.

Optionally, the apparatus comprises a first memory element, wherein the first tag and/or the second tag are stored in the first memory element.

It will be appreciated that the apparatus of the second aspect may include features set out in the first aspect and can incorporate other features as described herein.

BRIEF DESCRIPTION OF THE DRAWINGS

The disclosure is described in further detail below by way of example and with reference to the accompanying drawings, in which:

FIG. 3A is a schematic of a first electrical circuit, FIG. 3B is a schematic of the first electrical circuit with the addition of a trimming circuit.

FIG. 6A is a schematic of an apparatus in accordance with a fourth embodiment of the present disclosure, and FIG. 6B is a schematic of an apparatus in accordance with a fifth embodiment of the present disclosure;

FIG. 12 is a schematic of an apparatus that may be produced using the methods disclosed herein in accordance with a tenth embodiment of the present disclosure.

DESCRIPTION

Figure 5A:
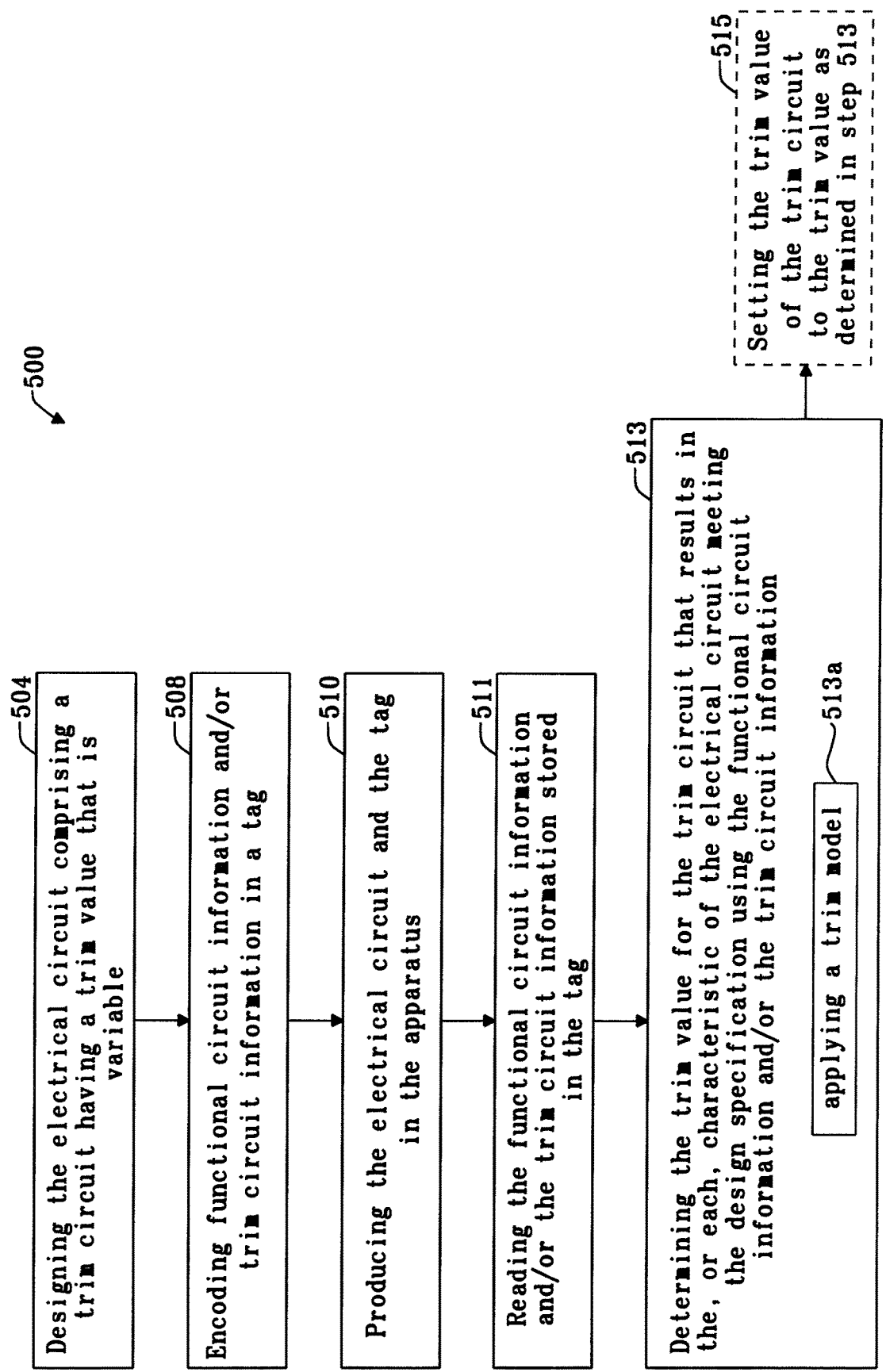
FIG. 5A is a flow chart of a method of producing an apparatus comprising an electrical circuit that has one or more characteristics that meet a design specification in accordance with a first embodiment of the present disclosure.

FIG. 5A is a flow chart of a method 500 of producing an apparatus 501 comprising an electrical circuit 502 that has one or more characteristics that meet a design specification in accordance with a first embodiment of the present disclosure. The method 500 comprises designing the electrical circuit 502 at a step 504.

The electrical circuit 502 comprises a trim circuit 506 that has a trim value X that is variable. The, or each, characteristic of the electrical circuit 502 is adjustable based on the trim value of the trim circuit 506.

The method 500 further comprises a step 508 of encoding functional circuit information and/or trim circuit information 514 in a tag 512. The functional circuit information may describe one or more properties of the part of the electrical circuit 502 that does not include the trim circuit 506. The trim circuit information may describe one or more properties of the trim circuit 506.

The method 500 further comprises producing the electrical circuit 502 and the tag 512 in the apparatus 501, at a step 510.

The procedure of generating the tag 512 in step 508 and producing the tag in step 510 may be referred to as "tagging". A trim circuit having an associated tag, such as the trim circuit 506 may be referred to as a tagged trim circuit. A tag may be used to associate trim circuits with models to determine optimal test program activities and conditions.

The functional circuit information and/or the trim circuit information 514 may be encoded using one or more methods/techniques. It will be clear to the skilled person that there are many methods within which it is possible to encode the functional circuit information and/or the trim circuit information 514. For example, encoding the trim circuit information 514 may comprise representing the trim circuit information 514 in binary code, as a QR code, an alphanumeric code, in words (for example written in English) describing one or more properties of the trim circuit 506, or pictorially.

The electrical circuit 502 may be designed using circuit design software. A design file may be generated using circuit design software, where the design file comprises information on the design of the electrical circuit 502. The design file may be provided in a standard electronic circuit design format as will be well known to the skilled person.

Prior to producing the electrical circuit 502 at step 510, the design file may be passed to a fabrication database that comprises information on how to fabricate circuits based on design information stored in electronic files of a suitable file format. The information may include instructions for operating semiconductor fabrication machines and tools. Using the information provided by the fabrication database the electrical circuit 502 may be fabricated. It will be appreciated that the design file may also comprise information on the tag 512, thereby enabling the tag 512 to be fabricated using the same process as for the electrical circuit 502 in this example.

The tag 512 may also comprise information on parts of the electrical circuit 502 other than the trim circuit 506, herein referred to as functional circuit information. The functional circuit information and/or the trim circuit information 514 may comprise at least a portion of the design file. The tag 512 may comprise part of the design file comprising the design of the electrical circuit 502 and the trim circuit 506. The tag 512 may comprise the whole design file comprising the design of the electrical circuit 502 and the trim circuit 506.

The functional circuit information and/or the trim circuit information 514 may comprise information derived during the design and/or fabrication processes.

The method 500 further comprises a step 511 of reading the functional circuit information and/or the trim circuit information stored in the tag 512 and a step 513 of determining the trim value X for the trim circuit 506 that results in the, or each, characteristic of the electrical circuit 502 meeting the design specification using the functional circuit information and/or the trim circuit information 514. Determining the trim value at the step 513 comprises applying a trim model at a step 513a. Determining the trim value at the step 513 may comprise providing the trim value as an output from the trim model.

It will be appreciated that reading the functional circuit information and/or the trim circuit information stored in the tag 512 may alternatively be referred to as "reading the tag 512".

The method 500 may comprise a step 515 of setting the trim value X of the trim circuit 506 to the trim value as determined in step 513.

In a specific embodiment, the trim circuit information 514 may comprise the trim model. In a further embodiment, applying the trim model in the step 513a may comprise providing the functional circuit information and/or the trim circuit information 514 to the trim model. Applying the trim model to the functional circuit information and/or the trim circuit information 514 may be used to determine the trim value where the trim value is provided as an output from the trim model.

It will be appreciated that in a further embodiment a first portion of the trim circuit information 514 may comprise the trim model and a second portion of the trim circuit information 514 may comprise information that is provided to the trim model. In this further embodiment, the first portion of the trim circuit information 514 may be acted upon by the trim model to provide the trim value as an output of the trim model. The trim value is "determined" using the trim model and this procedure may be referred to as "adaptive trim".

The trim circuit information 514 may comprise information on the trim circuit's 506 type. For example, the trim circuit 506 may comprise a variable resistor or a variable current source. The trim circuit information 514 may comprise information on the values of the components and/or the number of components that form the trim circuit 506.

The trim circuit information 514 may comprise information on a category of trim circuits within which the trim circuit 506 is associated.

The trim circuit information 514 may comprise information on the location and/or size of the trim circuit 506.

The trim circuit information 514 may comprise bit width information on the trim circuit 506.

The trim circuit information 514 may comprise other information on the physical properties of the trim circuit 506 in accordance with the understanding of the skilled person.

The tag 512 may comprise information about the electrical circuit 502 and/or the trim circuit's 506 type, the trim circuit's 506 associations with other trim circuit information related to other trim circuits, physical properties of the electrical circuit 502 and/or the trim circuit 506, electrical properties of the electrical circuit 502 and/or the trim circuit 506, orientation of the electrical circuit 502 and/or the trim circuit 506, and proximity of the electrical circuit 502 and/or the trim circuit 506 to other circuits.

The functional circuit information may comprise information about the electrical circuit's 502 type, physical properties of the electrical circuit 502, electrical properties of the electrical circuit 502, orientation of the electrical circuit 502, and/or proximity of the electrical circuit 502 to other circuits.

The trim circuit information may comprise information about the trim circuit's 506 type, the trim circuit's 506 associations with other trim circuit information related to other trim circuits, physical properties of the trim circuit 506, electrical properties of the trim circuit 506, orientation of the trim circuit 506, and proximity of the trim circuit 506 to other circuits.

The tag 512 may comprise information about a self-trim circuit, a trim island, a trim engine, or an auto-cal circuit.

In a further embodiment, the trim circuit 506 may be an IP block. The tag 512 can uniquely identify the IP block and also include data about features of the IP block.

As discussed previously, there may be variations between the physical circuit elements. The variations in circuit element parameters may be permanent, changing only once or a few times in the product life cycle. Additionally, the variations may change, for example, from lot to lot, from wafer to wafer, from reticule to reticule, from device to device, or may differ between similar structures within a single device. Information on these variations may be included as part of the tag 512. These variations are normally due to the process and testing environments. The process is normally monitored using wafer acceptance test (WAT) results. The data collected from these test results may be applied as an input to the trim model.

In a further embodiment, the tag 512 may comprise static and/or dynamic elements, where the dynamic elements can be used to track changes in the electrical circuit 502 or the trim circuit 506. The inclusion of dynamic elements enables the tag 512 to be updatable. The tag 512 may be updated for example using data determined from WAT results.

The circuit element parameters as measured during WAT can be used to establish the relationship between the physically produced electrical circuit 502 and the process models used to design the electrical circuit 502. In this case, the expression target circuit may be used to describe the designed circuit and to distinguish the designed circuit from the physically produced circuit. The target circuit will meet the design specification.

The tag 512 may comprise trim circuit information 514 on the trim circuit 506 as determined from the design process, the fabrication process and/or the testing process. The tag 512 may comprise trim circuit information 514 on the trim circuit 506 from previous design processes, fabrication processes and/or testing processes. The tag 512 may comprise trim circuit information 514 comprising statistics derived from previous design processes, fabrication processes and/or testing processes.

The trim model may, for example, be a mathematical function that receives inputs provided by the functional circuit information and/or the trim circuit information 514 and/or other parameters to provide as an output a suitable trim value X for the electrical circuit 502 to meet the design specification. In effect, the tag 512 may function as an input to the trim model.

The trim model may comprise one or more mathematical functions and may further comprise decision points and branches for selecting those functions.

The trim model may incorporate data analysis and machine learning techniques. The trim model may be used to predict how the trim circuit 506 will function under different conditions. In addition to receiving the functional circuit information and/or the trim circuit information 514, the trim model may also receive information on the process, the design and the test environment. The trim model can be used in both offline and online data processing. The tag 512 may also include information on the inputs to be taken from online and offline data sources and may include suggestions of machine learning techniques to apply for accurate and quick determination of the trim value. The tag 512 may also comprise information on the electrical circuit 502.

The trim model may receive inputs provided from the design process, the fabrication process and/or the test process. Additionally, the trim model may receive inputs from one or more databases. A trim model may be developed using these inputs, to reduce test time, improve yield, and/or improve future designs. The trim model may only consider key parameters, including the tag 512, and, thus may provide a result in a very short time compared to prior art models. The trim model may be created by considering parameters that are not available during the design process. For example, parameters available in fabrication process and the testing process. The trim model may be created by considering parameters, including the tag 512, in such a way to reduce time to provide a trim value in a very short time.

One or more of: the process models used at the design stage of the electrical circuit 502; the simulation results from the electrical circuit 502 at the design stage; the physical characteristics of the electrical circuit 502 at the design stage including orientation and its electrical characteristics may be provided as inputs to the trim model and/or may be stored in the tag 512.

The process models may be provided by a foundry that fabricates the circuit (step 106) or may be derived from special test structures used to emulate the targeted circuit. The data used to model the target circuit can include results from design verification or additional data based on special simulations performed specifically for the purpose of determining how the properties of the trim circuit 506 varies under given conditions. The tag 512 may also comprise information on the test structures to track associations with the trim circuits. The actual analysis or machine learning can occur either online or offline and include the associated tags plus any number of these factors.

The present example has been shown for a single electrical circuit 502, however it will be appreciated that a further embodiment may provide multiple electrical circuits each having an associated trim circuit each with an associated tag. This allows a test system to track different trim circuits in different environments and across different electrical circuits. The trim model can be both static and dynamic depending on the conditions.

Figure 1:
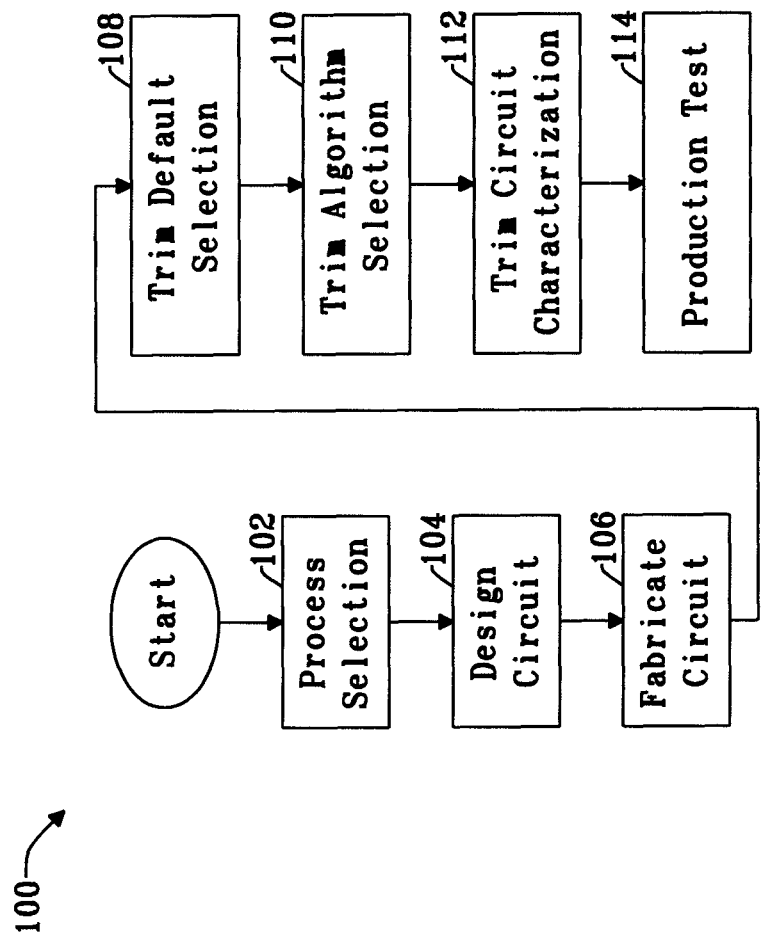
FIG. 1 is a flow chart showing a process flow for producing an electrical circuit comprising a trim circuit in accordance with the prior art.
Figure 2:
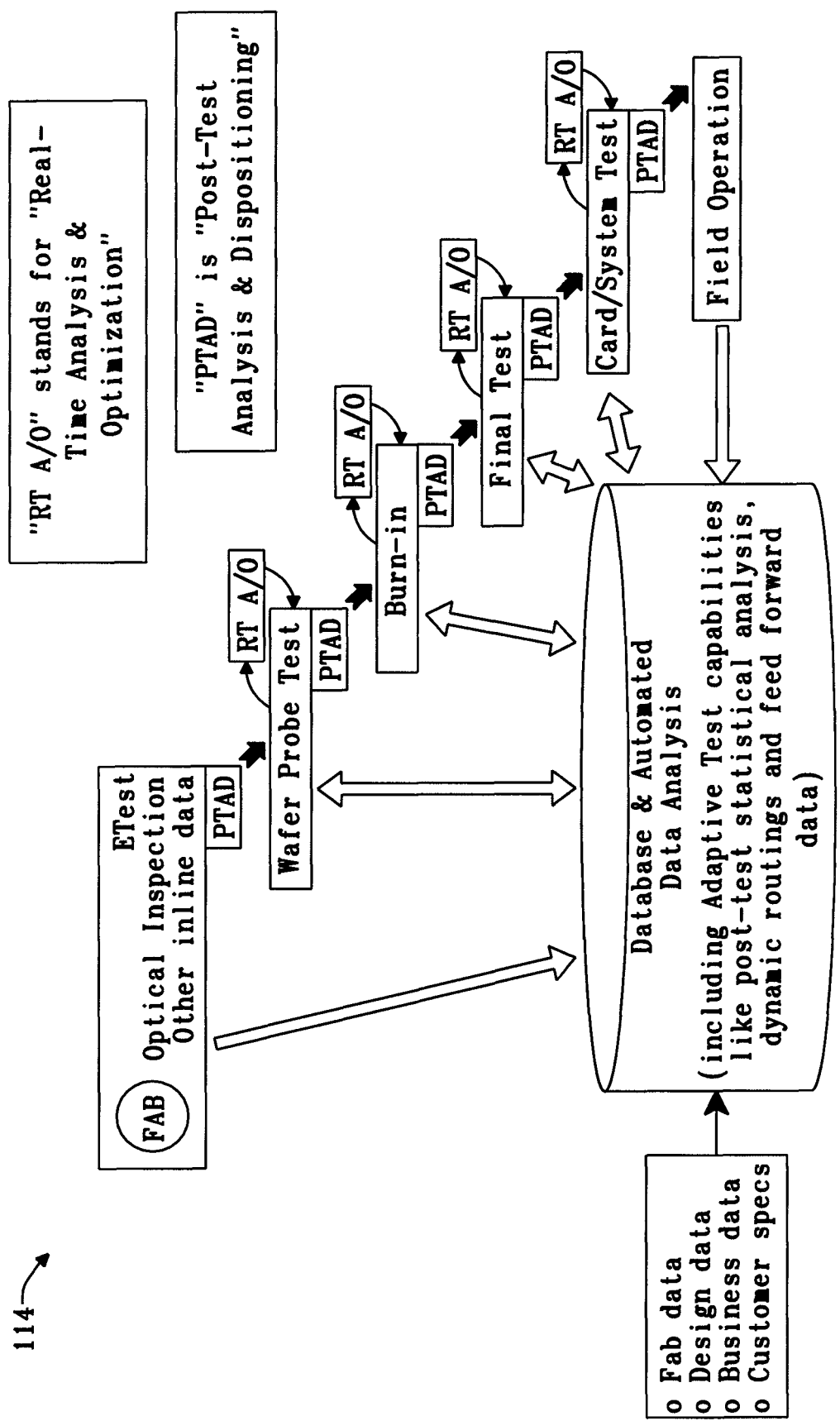
FIG. 2 is an illustration showing a standard data flow during production testing of the production testing step, as is known in the prior art.

The use of tagging enables information on the trim circuit 506 to be available to the test engineer during steps 108, 110, 112 and 114 as shown in FIG. 1. Using this information, the test engineer may determine a suitable trim value for the trim circuit 506 in a greatly reduced time compared with the prior art.

With reference to FIG. 1, a disadvantage of prior art methods is that the relationships between the steps are ad hoc and manual. There is little interaction between the steps and little feedback once a step is passed. The use of a tag 512 as described in this present disclosure enables information from the design and fabrication process to be stored and associated with the trim circuit 506 in a way that is easily accessible to a test engineer.

Tagging may help the production process associate trim circuits with trim models used to determine optimal test program activities and conditions.

The tag 512 may be read by the test engineer using the test equipment that is normally applied for testing electrical circuits 502 of the type described herein. For example, the test equipment may also be able to provide an input stimulus and measure an output, as described previously. In a further embodiment, the tag 512 may be readable using a piece of equipment that is separate from the test equipment.

The inclusion of the tag 512 enables the test engineer to quickly and efficiently access and use information that aids in the determination of the appropriate trim value. This is particularly advantageous when a test engineer has to set the trim values for multiple electrical circuits, each having associated trim circuits and tags. Prior art methods do not use tagging for the trim circuit, and therefore do not provide the advantages of the methods disclosed herein.

Determining of the trim value may be carried out solely by using the information stored in the tag 512. Alternatively, determination of the trim value may be carried out by using the information stored in the tag 512 in addition to the application of other testing procedures. The other testing procedures may, for example, be the application of input stimulus, measurement of an output, and adjustment of the trim value, as discussed previously.

The tag 512 may be read automatically (step 511) as part of one of the steps 108-114. Additionally, determination of the trim value at step 513 may be a partially or fully automated process, that requires limited or no input from the test engineer.

The tag 512 and its functional circuit information and/or its trim circuit information 514 may be readable electrically, for example through a "read to an address" command or may be observable through optical inspection via layout markings.

The use of tagging can lead to test time reduction, design improvement and yield improvement because the functional circuit information and/or the trim circuit information 514 held in the tag 512 can enable the test engineer to arrive at the necessary trim value faster than currently available in the prior art.

Figure 3C:
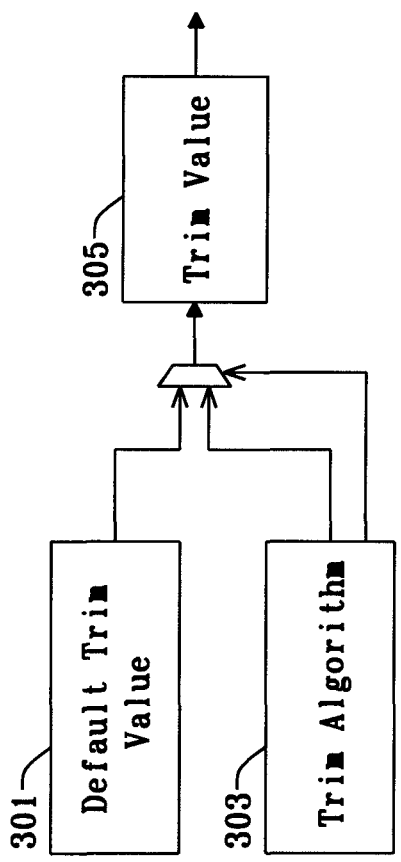
FIG. 3C is a flow diagram providing a general overview of the process of determining the trim value.
Figure 3D:
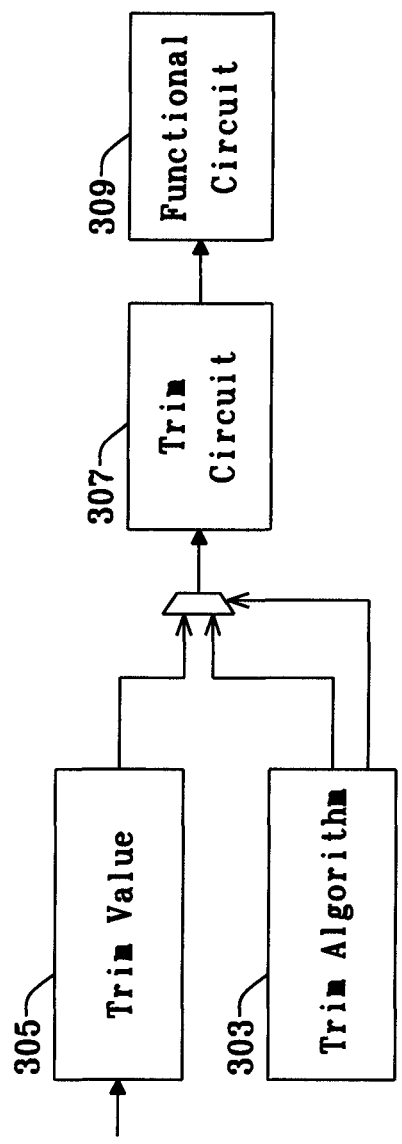
FIG. 3D is a flow diagram providing a general overview of the process of setting the trim value.

With reference to FIGS. 3A, B, E and F each of these circuits could have a different tag due to identify the different trim circuits.

Figure 5B:
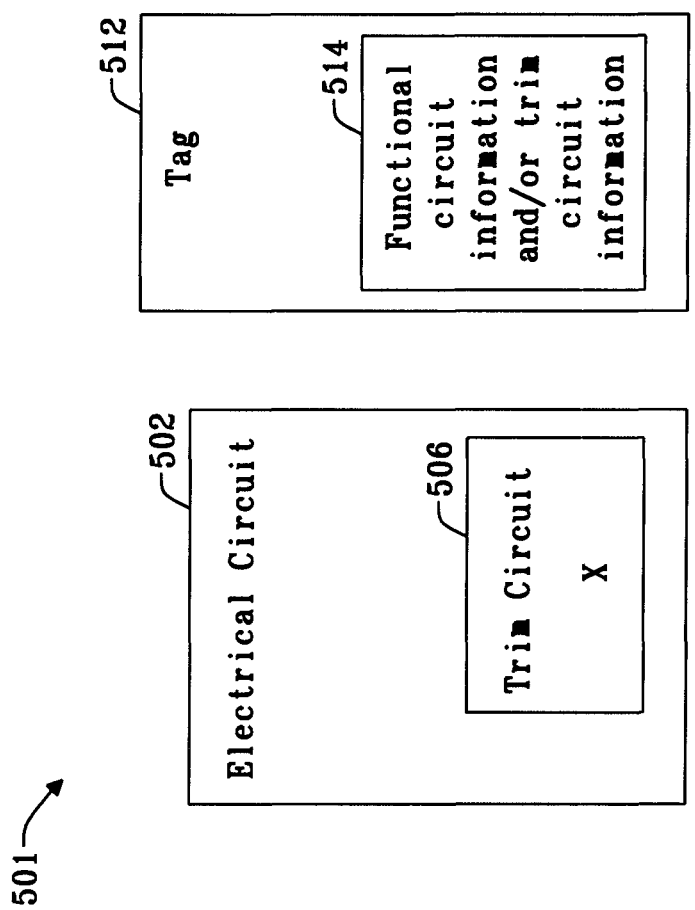
FIG. 5B is a schematic of the apparatus produced using the method of FIG. 5A.

FIG. 5B is a schematic of the apparatus 501 produced using the method 500, where the reference numerals have their meaning as previously described. The tag 512 comprises the functional circuit information and/or the trim circuit information 514 and the functional circuit information and/or the trim circuit information 514 is encoded in the tag 512. The functional circuit information and/or the trim circuit information 514 stored in the tag 512 is configured to be readable to enable extraction of the functional circuit information and/or the trim circuit information 514.

The electrical circuit 502 may, for example, be the electrical circuit 312 of FIG. 3B where the trim circuit 506 of the method 500 corresponds to the trim circuit 314. In this example, the trim value X is the resistance R of the trim circuit 314 which can be adjusted to alter the, or each, characteristic of the electrical circuit 312 until the design specification is met.

Figure 3F:
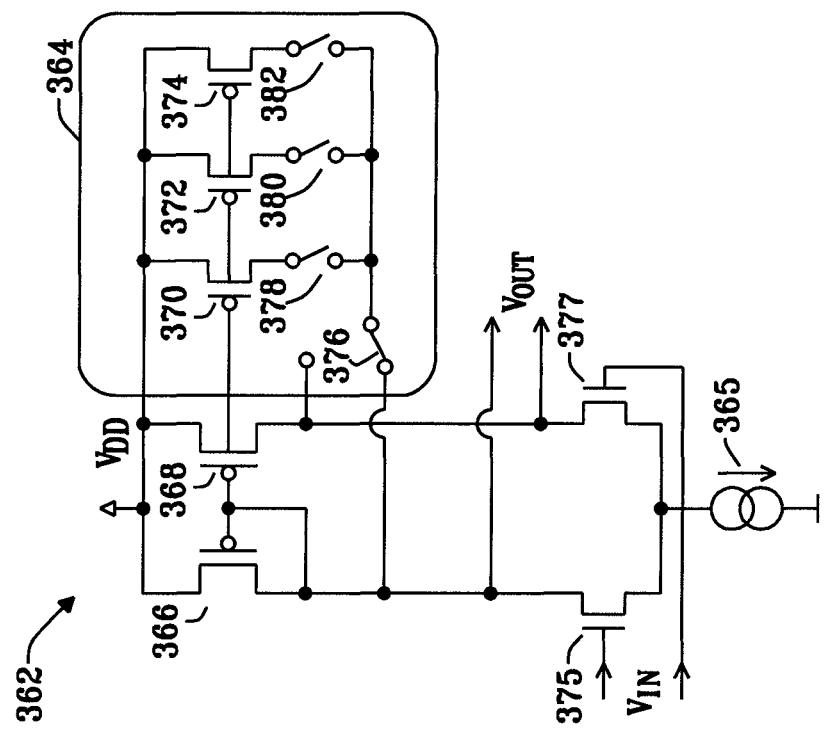
FIG. 3E is a schematic of a second electrical circuit with a trimming circuit and FIG. 3F is a schematic of a third electrical circuit with a trimming circuit.
Figure 3E:
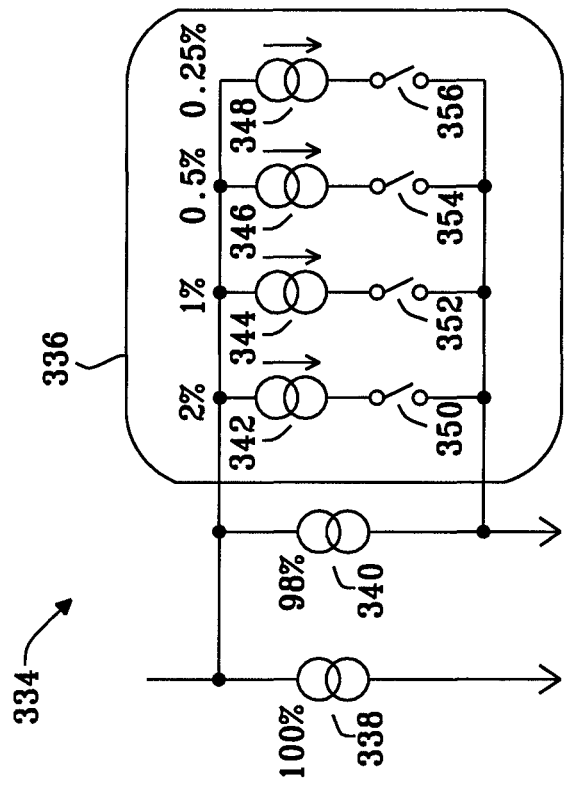

It will be clear that a resistor is just one example of an element to be trimmed. Different types of trimmable elements are shown in FIGS. 3E and 3F. Other types of trimmable elements will be well known to the skilled person.

The trim circuit information 514 may comprise an identifier for the trim circuit 506. Tagging may allow the unique identification of a trim circuit.

The identifier may act as a reference to extract information on the trim circuit 506 that is stored in a database. The information extracted from the database may then be used to determine the trim value.

The tag 512 associated with the trim circuit 516 can make its properties and trim model easily accessible to the test engineer; it enables simple categorization; and can be used to inform decisions necessary for dynamic trim optimization online during production for determination of the trim value required to meet the design specification.

Figure 5C:
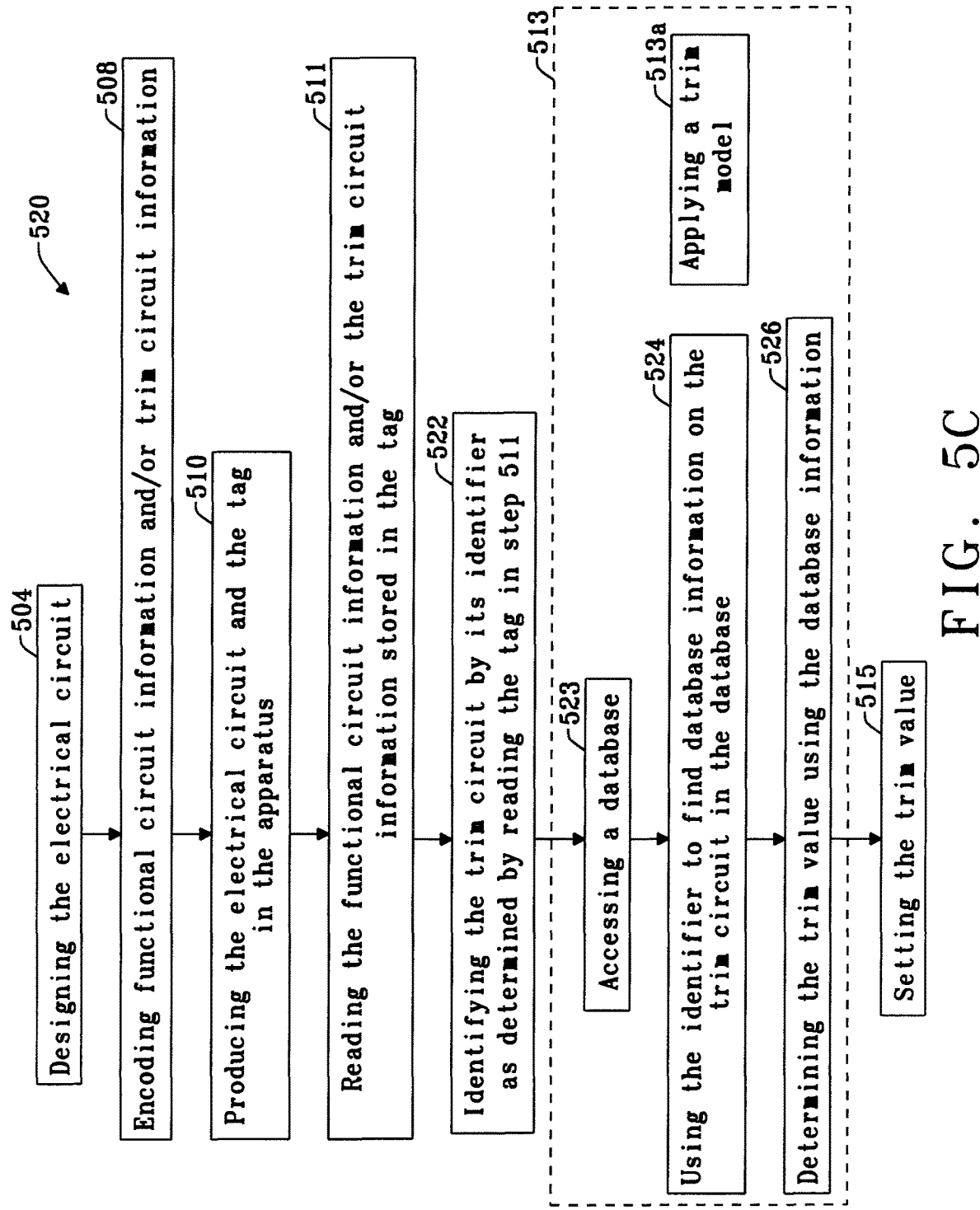
FIG. 5C is a flow chart of a method in accordance with a second embodiment of the present disclosure and, FIG. 5D is a flow chart of a method of producing the apparatus in accordance with a third embodiment of the present disclosure.

FIG. 5C is a flow chart of a method 520 in accordance with a second embodiment of the present disclosure. The method 520 corresponds to a specific example of the method 500 where the trim circuit information 514 comprises an identifier for the trim circuit 506. In a further embodiment the trim circuit information 514 may comprise an identifier for the trim model. Common reference numerals between Figures represent common features and steps.

In addition to the steps discussed for the method 500, the method 520 comprises a step 522 of identifying the trim circuit 506 by its identifier as determined by reading the trim circuit information 514 at the step 511. Determining the trim value at the step 513 comprises accessing a database (step 523), using the identifier to find database information on the functional circuit and/or the trim circuit 506 in the database (step 524) and determining the trim value using the database information found in the database (step 526).

The identifier may, for example, be a reference to access the design file for the electrical circuit 501 in the database. The database information found in the database may comprise the trim model. Applying the trim model may comprise providing the database information to the trim model. As discussed previously, the trim value may be determined by using the trim model at the step 513a, where an output of the trim model is the trim value.

Reading the tag 512 and accessing the database may be an automated process that does not require user input.

FIG. 5D is a flow chart of a method 530 of producing the apparatus 501 in accordance with a third embodiment of the present disclosure. The method 530 corresponds to a specific example of the method 500. Common reference numerals between Figures represent common features and steps.

The step 513 of determining the trim value comprises applying a trim algorithm at a step 513b. The step 513b may correspond to applying the trim algorithm 110 as described in the prior art. As described previously, the trim algorithm is the process that is applied to determine a trim value that enables the design specification to be met. The trim algorithm in effect "searches" for the trim value that will provide the desired performance of the electrical circuit.

The trim circuit information 514 may comprise the trim algorithm. The trim algorithm may be the trim algorithm that is optimal for the trim circuit 506. The trim algorithm may be applied to the trim circuit 506 by the test equipment, by a self-trim circuit, or by an auto-cal circuit. The trim algorithm may comprise one or more trim models.

The trim circuit information 514 may comprise one or more of the following: the trim model, the trim algorithm, a portion of the trim model and a portion of the trim algorithm.

The trim algorithm may be applied by automated test equipment (ATE), which may be configured to perform the steps of the trim algorithm by a test engineer.

In a specific embodiment, determining the trim value may comprise providing a default trim setting as an output from the trim model and using the default trim setting as a starting trim value for the trim circuit 506 in application of the trim algorithm. An output of the trim algorithm would then be the trim value required for the electrical circuit 502 to meet the design specification.

It will be appreciated that the methods disclosed herein that use the trim model to determine the trim value may be applied to determine a default trim setting as a starting point ("the starting trim value") for the trim algorithm, in accordance with the understanding of the skilled person.

In a further embodiment, the method 530 may comprise selecting the trim algorithm that is applied based on an output of the trim model, an output of the trim algorithm being the trim value.

In a further embodiment, the method 530 may comprise setting one or more parameters of the trim algorithm based on an output of the trim model, an output of the trim algorithm being the trim value.

In a further embodiment, application of the trim model may be carried out as a step of a trim algorithm.

FIG. 6A is a schematic of an apparatus 600 in accordance with a fourth embodiment of the present disclosure. The apparatus 600 corresponds to the apparatus 501 as previously described, but with additional features. Common reference numerals between Figures represent common features.

The apparatus 600 comprises a substrate 602 and the tag 512 is fabricated in the substrate 602. The tag 512 in this case may be referred to as a physical tag as it is physically implemented as part of the substrate 602. In the present embodiment, the electrical circuit 502 is also fabricated in the substrate 602. The substrate 526 may be a semiconductor and may, for example, comprise silicon. The substrate may be a wafer or may be an individual piece/chip. The substrate 602 may be packaged in an electronic package (not shown in FIG. 6A).

In the present embodiment the tag 512 is embedded in the substrate 602 and may function as a physical identifier for the trim circuit 506. The tag 512 embedded in the substrate 602 may be visible by manual or automatic optical inspection of the substrate 602.

With reference to step 510 of the methods 500, 520 as previously described and applied to the present embodiment, the step 510 further comprises fabricating the electrical circuit 502 and the tag 512 in the substrate 602.

It will be appreciated that in a further embodiment, the apparatus 600 may comprise an additional substrate, and the electrical circuit 502 and the tag 512 may be fabricated in different substrates.

FIG. 6B is a schematic of an apparatus 604 in accordance with a fifth embodiment of the present disclosure. The apparatus 600 corresponds to the apparatus 501 as previously described, but with additional features. Common reference numerals between Figures represent common features.

The apparatus 604 comprises an electronic package 606 that is marked with the tag 512. The apparatus 604 may further comprise the substrate 602 where the electrical circuit 502 is fabricated in the substrate 502. In the present embodiment, the substrate 602 is packaged in the electronic package 606.

The tag 512 marked on the electronic package 606 may be visible using manual or automatic optical inspection methods.

With reference to step 510 of the methods 500, 520 as previously described and applied to the present embodiment, the step 510 further comprises marking the package 606 with the tag 512, fabricating the electrical circuit 502 in the substrate 604 and packaging the substrate 604 in the electronic package 606.

It will be appreciated that in a further embodiment, the apparatus 604 may comprise an additional electronic package, and the substrate 604 may be packaged in a electronic package that differs from the one marked by the tag 512.

In a further embodiment, a portion of the functional circuit information and/or the trim circuit information 514 may be marked on the electronic package 606 with a further portion being fabricated in the substrate 602.

Figure 7:
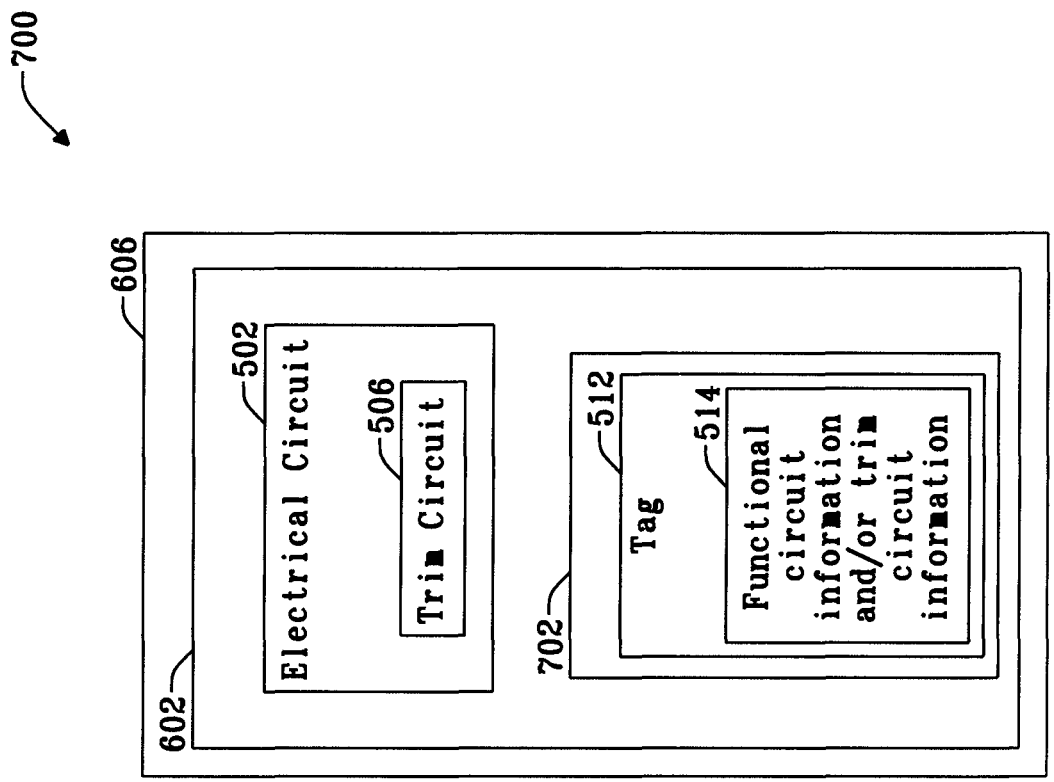
FIG. 7 is a schematic of an apparatus in accordance with a sixth embodiment of the present disclosure.

FIG. 7 is a schematic of an apparatus 700 in accordance with a sixth embodiment of the present disclosure. The apparatus 700 corresponds to the apparatus 501 as previously described, but with additional features. Common reference numerals between Figures represent common features.

In the present embodiment, the apparatus 700 comprises a memory element 702. The tag 512 is stored in the memory element 702. In the present embodiment, the memory element 702 and the electrical circuit 502 are fabricated in the substrate 604. The substrate 604 is packaged in the electronic package 606.

The memory element 702 may be a non-volatile memory and may, for example, comprise ROM, fuses, OTP memory, MTP memory or Flash memory. For an embodiment where the memory element 702 comprises ROM, the ROM may be programmed before testing. The ROM may be programmed prior to testing using photo-masks during wafer processing.

The tag 512 may be written to the memory element 702 as part of the trimming process or at another step in the procedure, in accordance with the understanding of the skilled person.

With reference to step 510 of the methods 500, 520 as previously described and applied to the present embodiment, the step 510 further comprises storing the tag 512 in the memory element 702.

Prior to storing the tag 512 in the memory element 702, the method 500 (or the method 520) may comprise a step of fabricating the memory element 702 in the substrate 604. Step 510 may further comprise fabricating the electrical circuit 502 in the substrate 604. Reading the tag from the memory element 702 may be referred to as accessing the tag 512 "electrically". The memory element 702 may be readable using the standard test equipment used by the test engineer.

It will be appreciated that in a further embodiment, the memory element 702 and the electrical circuit 502 may be fabricated in different substrates. Each of the two different substrates may be packaged in the same electronic package or may be packaged in different electronic packages.

Figure 8:
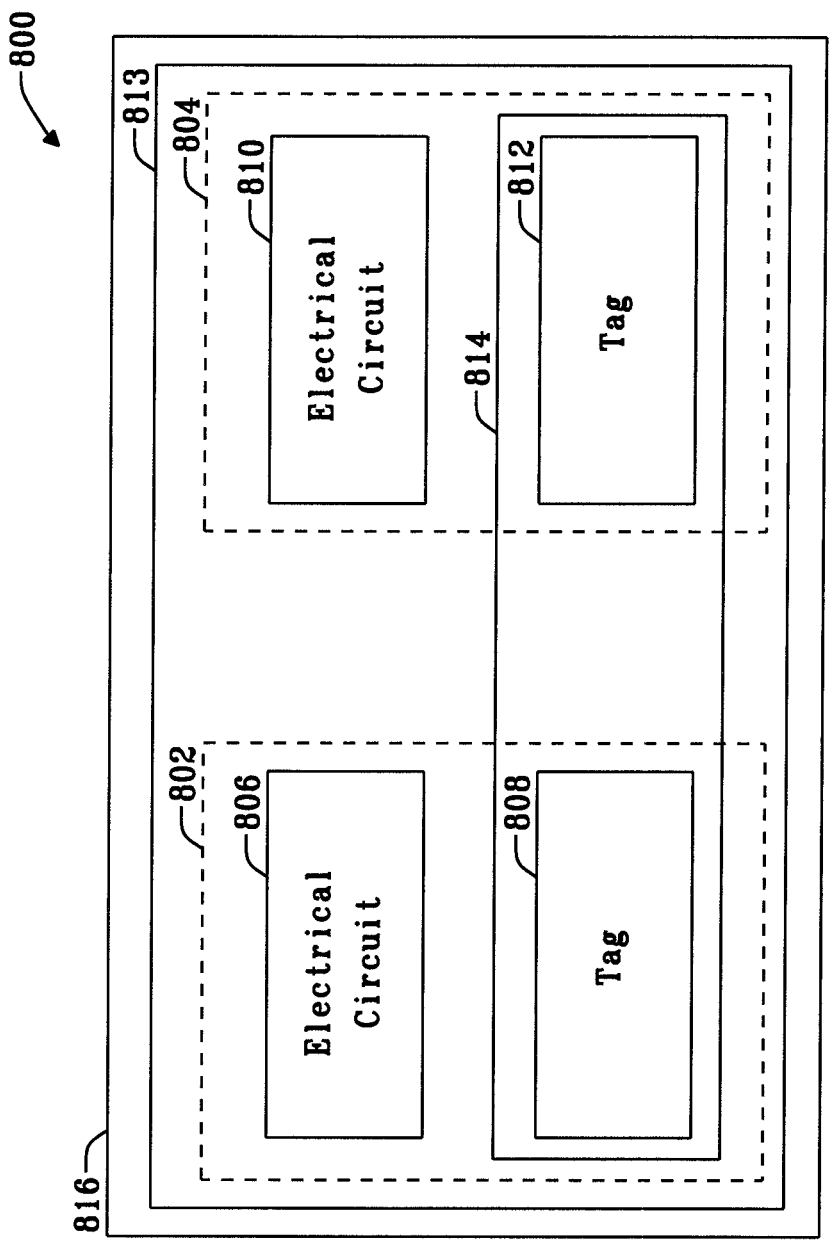
FIG. 8 is a schematic of an apparatus in accordance with a seventh embodiment of the present disclosure.

FIG. 8 is a schematic of an apparatus 800 in accordance with a seventh embodiment of the present disclosure. In the present embodiment the apparatus 800 comprises two apparatus 802, 804, which may each correspond to the apparatus 501, as previously described. It will be appreciated that in a further embodiment, the apparatus 800 may comprise any two or more apparatuses as described herein and in accordance with the understanding of the skilled person. Common reference numerals between Figures represents common features.

The apparatus 802 comprises an electrical circuit 806 and a tag 808 where the electrical circuit 806 and the tag 808 correspond to the electrical circuit 502 and the tag 512, respectively, as described previously. The apparatus 804 comprises an electrical circuit 810 and a tag 812 where the electrical circuit 810 and the tag 812 correspond to the electrical circuit 502 and the tag 512, respectively, as described previously.

In the present embodiment, the apparatus 800 comprises a substrate 813 and both electrical circuits 806, 810 are fabricated in the substrate 813. It will be appreciated that in a further embodiment the electrical circuits 806, 810 may be fabricated in different substrates.

In the present embodiment the apparatus 800 comprises an electronic package 816 and the substrate 813 is packaged in the electronic package 816. In a further embodiment where there are multiple substrates, each of the substrates may be packaged in the same electronic package 816 or in different electronic packages, in accordance with the understanding of the skilled person.

In the present embodiment, the apparatus 800 comprises a memory element 814. At least one of the tags 808, 812 may be stored in the memory element 814. In the present embodiment the memory element 814 and the apparatuses 802, 804 are fabricated in the same substrate 813. It will be appreciated that in further embodiments one or more of the apparatuses 802, 804 and the memory element 814 may be fabricated in different substrates.

In a further embodiment, as an alternative to, or in addition to, storing the tags 808, 812 in the memory element 814, the tags 808, 812 may be marked on an electronic package 816, where the apparatus 800 comprises the electronic package 816. In a further embodiment, multiple electronic packages may be marked with the tags 808, 812.

In a further embodiment, as an alternative to, or in addition to, storing the tags 808, 812 in the memory element 814 and/or marking on an electronic package 816, the tags 808, 812 may be fabricated into the substrate 812. In a further embodiment the tags 808, 812 may be fabricated into different substrates from each other. The tags 808, 812 may be fabricated into the same substrates as their associated electrical circuits 806, 810 or may be fabricated in different substrates.

In a further embodiment there may be provided multiple memory elements where each memory element stores one or more tags.

The trim model associated with the trim circuit of the apparatus 802 may differ from the trim model associated with the trim circuit of the apparatus 804. Alternatively, the trim models may be the same. The tags 808, 812 may be used to distinguish between the two different trim circuits.

For a suitably small substrate, or wafer, having multiple trim circuits there is likely to be little variation between trim circuits due to their proximity to each other. Additionally, over the surface of a large wafer, trim circuits close to each other are likely to exhibit similar properties. A simple trim model may assume uniform distribution of trim circuit properties across the wafer and this can be predicted from PCM/WAT data. Alternatively, a baseline value can be determined from the first few touch downs. This approach may work for simple trim circuits against sheet parameters like resistance or capacitance. Often, however, the process results in trim circuit variations that form doughnut, radial, or other shapes which need more sophisticated trim modelling. Each of the above-mentioned techniques can be used individually or in combination. They can be thought of as separate inputs to a multivariate model.

In summary, distribution of trim circuits across a substrate or a wafer can have an effect on the physical parameters of the trim circuits, even if their designs are identical. This may be referred to as the trim distribution, which may be predictable for any given design. These types of trim distributions typically fall into three different categories: a Gaussian distribution, an exponential distribution, and a uniform distribution. The type of trim distribution may be a primary determining factor in the default condition (step 108), trim algorithm (step 110), and trim circuit selection (step 102). Information on the trim distribution may be embedded in one or more of the tags. For example, in FIG. 8, each of the tags 808, 812 may include information on the distribution of the trim circuits of the electrical circuits 806, 810 across the substrate 813.

Figure 9:
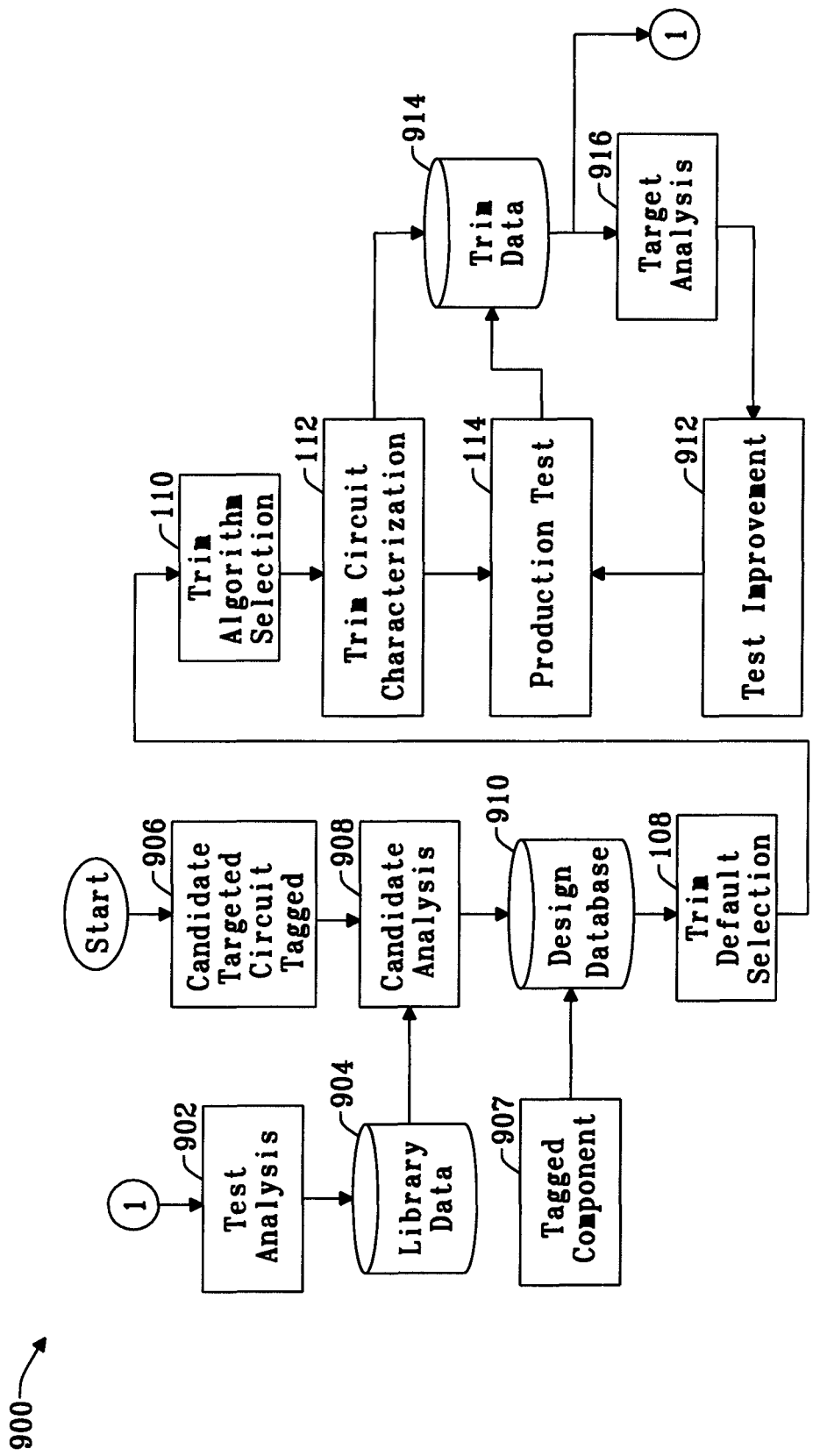
FIG. 9 is a flow chart showing a process flow in accordance with a eighth embodiment of the present disclosure.

FIG. 9 is a flow chart showing a process flow 900 in accordance with a eighth embodiment of the present disclosure. Common steps between Figures are represented by common reference numerals.

The process flow 900 uses, at step 902, test analysis. The result of the test analysis step is the formulation of an electrical circuit model that is representative of the electrical circuit 502 as designed in the design process and meeting the design specification (which also may be referred to as the target circuit, as discussed previously).

This electrical circuit model can be used to represent the target circuit in a variety of use cases. The initial electrical circuit model may be created based on historical data from previous electrical circuits with associated tags, WAT or ETest Data, and characterization data from the split lot material. Once the electrical circuit model is created it can be modified over time depending on new, wafer specific, WAT or ETest Data, other identical circuits tested within the same lot, and other similar circuits tested on the same die.

The electrical circuit model is provided to a library at a step 904. At a step 906 a candidate target circuit is tagged. At step 907 a component is tagged. At step 908 candidate analysis is performed. At step 910 a design database is accessed. At step 912 test improvement is carried out. Trim circuit information is shown by a block 914 which may be read or written to. A second test analysis step is carried out at step 916.

Figure 10:
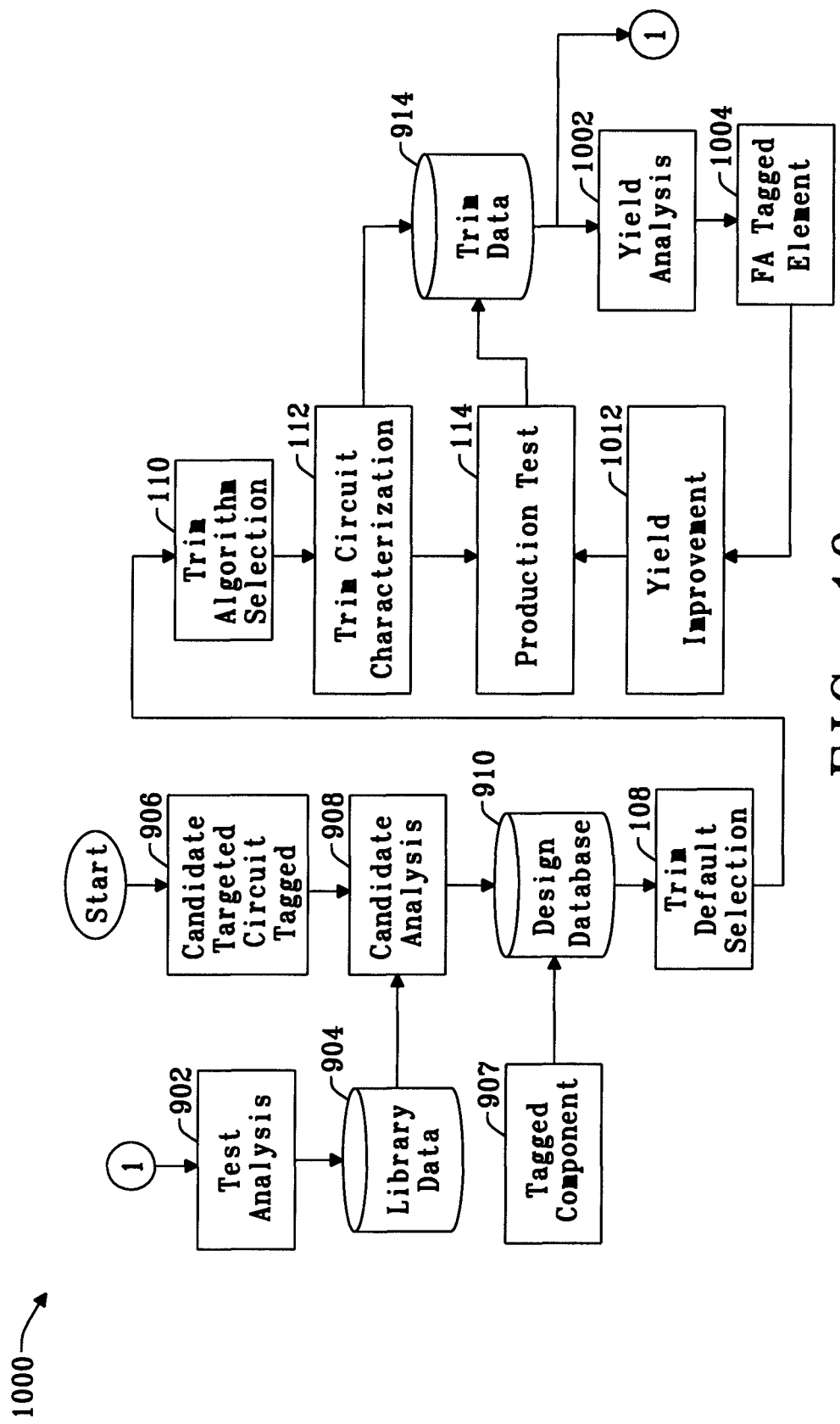
FIG. 10 is a flow chart showing a process flow in accordance with an ninth embodiment of the present disclosure.

FIG. 10 is a flow chart showing a process flow 1000 in accordance with a ninth embodiment of the present disclosure. Common steps between Figures are represented by common reference numerals. FIG. 10 shows the electrical circuit model applied to the yield improvement process. In this example, the electrical circuit model is used as the input to a yield analysis step. There is shown, at step 1002, yield analysis, at step 1004, FA tagged element and at step 1012, yield improvement.

Figure 4:
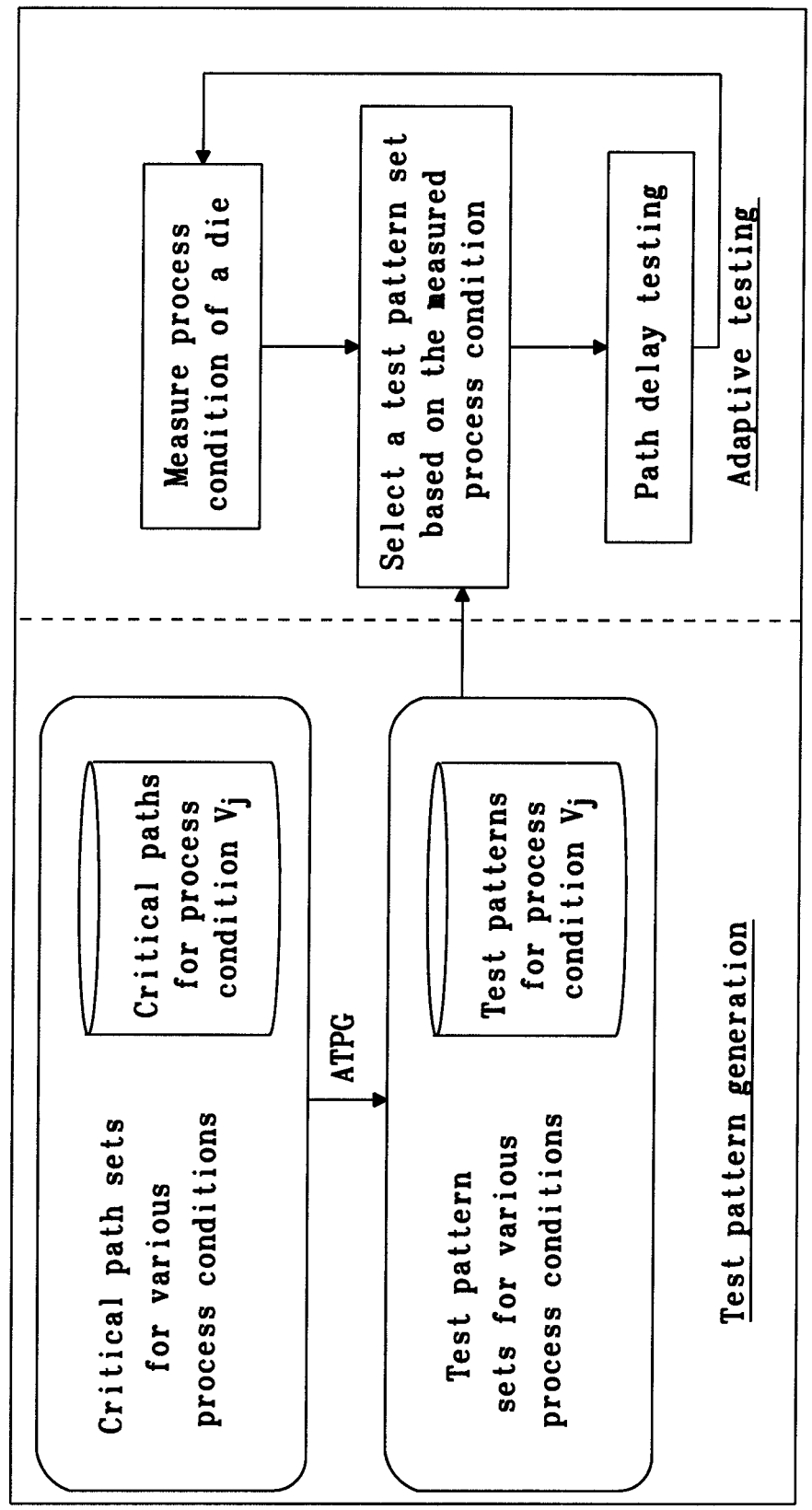
FIG. 4 is an example of adaptive testing as applied to path delay tests.
Figure 11:
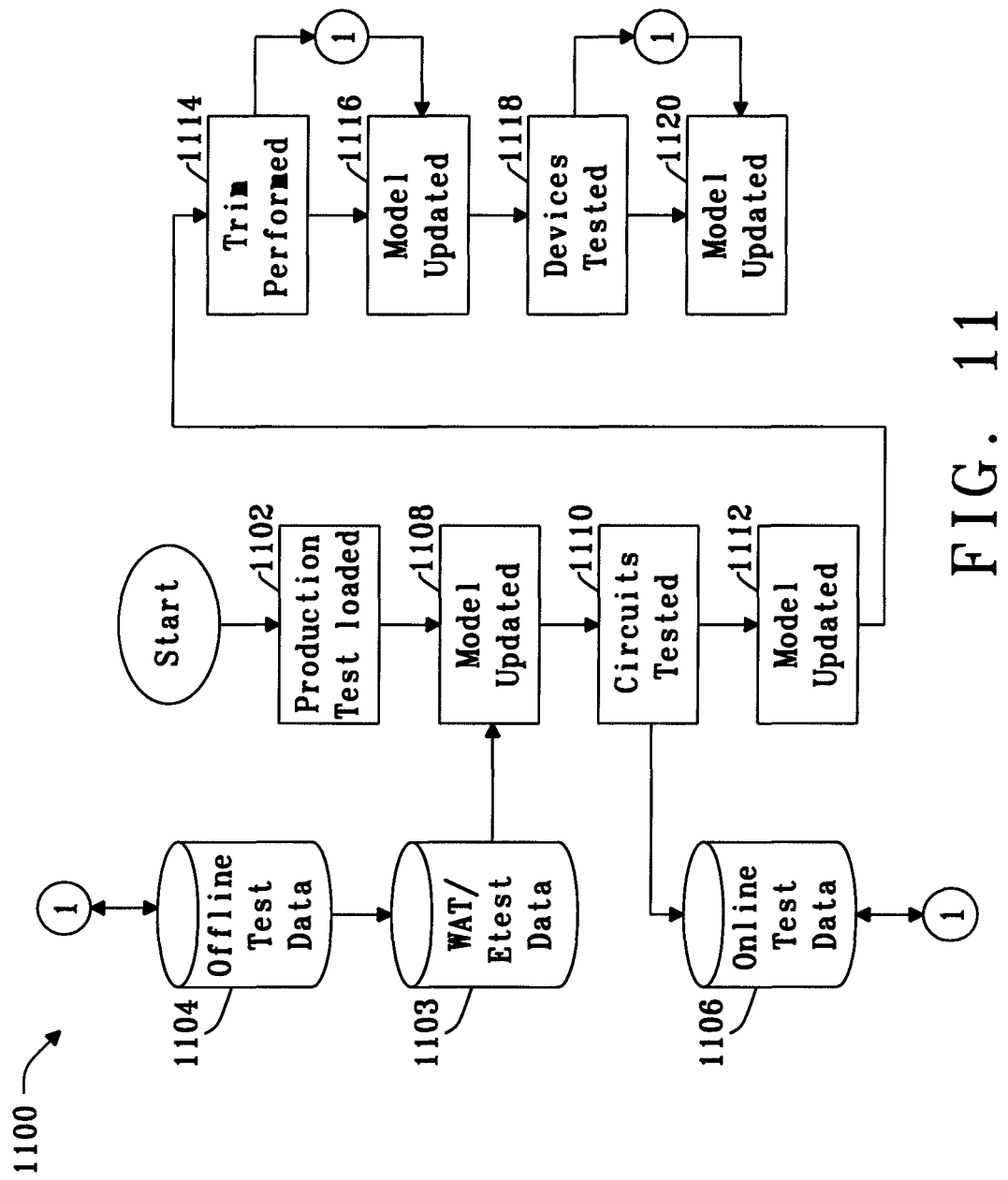
FIG. 11 is a flow chart showing the dataflow for production testing relative to the trim operations.

FIG. 11 is a flow chart 1100 showing the dataflow for production testing relative to the trim operations. The trim model for the trim circuit 506 may be formulated as part of the "Test Improvement" step in FIG. 9 (step 912). As shown in FIG. 4, there are both Real-Time Analysis and Optimization (RT A/0) and Post-Test Analysis and Dispositioning (PTAD) steps for each test point in the production test data flow.

As shown in FIG. 11, the test process starts with the loading of the test program at step 1102. The test program may include the previously developed trim models for each of the trim circuits associated with the device under test (DUT). Based on the tag, the trim model for each trim circuit takes inputs from both online and offline data sources. These inputs include, but are not limited to, the tag itself, WAT test data (labelled 1103), device evaluation test data, device characterization test data, circuit test data, trim circuit information, and associated data from other devices, wafers, lots, and fabs as is deemed relevant.

The test process shown in FIG. 11 also comprises steps of updating the model (step 1108), circuit testing (step 1110), updating the model (step 1112), performing a trim operation (step 1114), updating the model (step 1116), device testing (step 1118) and updating the model (step 1120).

Other design and business data are made available as appropriate. Data is transferred between the offline 1104 and online 1106 databases at any appropriate interval for optimized test performance based on the associated tag. Using the tag, online data is used for RT A/0, and offline data is used for PTAD.

Consider the electrical circuit 312 of FIG. 3B. The electrical circuit 312 is likely implemented in a similar fashion across many designs in a given process. It may also be tested many millions of times within for example, a year. The methods described herein would assign a tag to the trim circuit and use a trim model to quickly and accurately predict the trim value for R' that will enable the electrical circuit 312 to meet the design specification. R' is a summation of the resistance values of resistors 316-324. This R' is for the trim circuit 314. There is typically an optimal value for R' that will enable the electrical circuit 312 to meet the design specification. Determining this optimal value is a lengthy process in the prior art and is currently accomplished by setting R' to multiple different values and measuring the current i2. Once R' is set to the correct value, so that i2 is within spec as defined by the design specification, the settings for R' that produce the current i2 are stored and used for the remainder of that individual electrical circuit's 312 life.

FIG. 12 is a schematic of an apparatus 1200 that may be produced using the methods disclosed herein in accordance with a tenth embodiment of the present disclosure, and the present example will be discussed with reference to the method 530. The reference numerals have their meaning as previously described. In particular, the apparatus 1200 represents a specific embodiment of the apparatus 501 that comprises features of the electrical circuit 312. The trim circuit 506 corresponds to the variable resistor 314 as discussed previously.

Compared to the electrical circuit 312, the apparatus 532 further comprises the tag 512 comprising the encoded functional circuit information and/or the trim circuit information 514. The apparatus 1200 further comprises the memory element 702, and the tag 512 is stored in the memory element 702. It will be appreciated that the tag 512 may be stored by another means, for example as described herein, and in accordance with the understanding of the skilled person. For example, the tag 512 may be marked on an electronic package as discussed previously.

In the present embodiment, the apparatus 1200 comprises a substrate (not shown) where the electrical circuit 502 and the memory element 702 are fabricated on the substrate. It will be appreciated that the constituent parts of the apparatus 1200 may be fabricated on different substrates, for example as described herein, and in accordance with the understanding of the skilled person.

With reference to the method 530 the steps 504, 508, 510 are performed prior to production testing. The following steps, in the present embodiment, are carried out by a test engineer. In a further embodiment the following steps may be carried out by automatic testing equipment (ATE) which may be programmed by the test engineer to carry out the steps.

In a specific embodiment, the test engineer may simply start a BIST that has previously been designed by the design engineer. In a specific embodiment the test engineer may be required to write a complex algorithm, which may, for example, comprise the trim algorithm.

At the step 511 the test engineer reads the functional circuit information and/or the trim circuit information 514 stored in the tag 512. The functional circuit information and/or the trim circuit information 514 may be read using standard methods for reading data from a memory element, in accordance with the understanding of the skilled person.

The functional circuit information and/or the trim circuit information 514 may comprise the trim model, information on the trim circuit 506 that may be provided to the trim model, an identifier, the trim algorithm, or a combination of two or more of the preceding items in accordance with the understanding of the skilled person.

In the present example, the trim circuit information 514 comprises information on the trim circuit 506 as has been described previously. This information may, for example, have been determined from test results from previously fabricated versions of the trim circuit 506.

In the present example, we will consider trim circuit information 514 comprising information on the values of the components that form the trim circuit 506 (the resistors 316-324) and the location of the trim circuit 506 on the substrate. Based on prior knowledge of how the component values and location on the trim circuit 506 on a substrate impact the trim value of the physically fabricated trim circuit 506, the trim model can output a trim value that is close to the required trim value to meet the design specification.

For example, the trim circuit 506 shown in FIG. 12 (a variable resistor) may be designed to have a resistance of 10Ω when all switches 326-332 are open an all resistors 316-324 form a series combination. However, in practice, the values of the constituent resistors may have been 10% less than their designed values resulting in a resistance of 9Ω. This information may have been recorded from previous fabrications of the trim circuit 506. The trim model may be used to determine how the trim circuit 506 will vary under different conditions.

Additionally, for a trim circuit 506 near the edge of a substrate, there may be an increase in resistance of 3Ω, resulting in a total resistance of 12Ω when compared to the designed resistance. This information may also have been recorded from previous fabrications of the trim circuit 506.

Using this information, it is possible to derive a trim model that relates the resistance of the designed trim circuit 506 to the resistance of the fabricated trim circuit 506. Using this trim model, it is possible to determine how to set the trim circuit 506 to provide a resistance close to the target 10Ω. This may provide a suitable trim value to provide the required electrical circuit 502 performance to meet the design specification. Alternatively, the trim value determined using the model may function as a default trim setting that is used by a trim algorithm to refine the initial default trim setting to provide the final trim value. After determining the trim value, it may be stored in the memory element 702. The trim value of the trim circuit 506 may be "set" by providing the trim value from the memory element 702 to the trim circuit 506 when the apparatus 1200 is in use.

The default trim setting may be an offset to a value that is already provided by the trim algorithm as a starting point for the trim value.

The default trim setting, the trim model and/or the trim algorithm may also be stored in the memory element 702.

Prior art systems either use a default trim setting of zero, or an arbitrarily chosen trim setting. By determining the default trim setting using the trim model it is possible to determine a better "starting point" ("the starting trim value") for the trim algorithm than the prior art methods can provide. This can result in a substantial decrease in test time.

The trim algorithm may be used to select from two or more trim models. As the trim tag can use information on the trim circuit to determine aspects of the trim circuit, it can be used to select the most appropriate trim model to provide fast results with a short test time. The output of the trim model may also be used to adjust parameters of the trim algorithm to provide an optimised testing procedure that can result in shorter test time.

In a further embodiment, the output of the trim model may be used to select from two or more trim algorithms. As the trim model can use information on the trim circuit to determine aspects of the trim circuit, it can be used to select the most appropriate trim algorithm to provide fast results with a short test time. The output of the trim model may also be used to adjust parameters of the trim algorithm to provide an optimised testing procedure that can result in shorter test time.

Each test step shown in FIG. 9 and FIG. 10 produces multiple results that are stored in a database. By monitoring these test results multiple correlations can be determined that predict the optimum value for R'. A trim model may then be formed based on these test results and associated with the tag for a given trim circuit, or a collection of tags.

The contributions from Etest data can be represented as e1, e2, and so on. Similarly, contributions from wafer test data could be represented as w1, w2, and so on. These results are then used to predict an optimum value for R' for that tagged trim circuit (the trim circuit 506), where the predicted value may be represented as follows:

$$R''=E1e1+E2e2+\ldots+W1w1+W2w2+\ldots \quad (1)$$

where E1, E2, W1 and W2 are weighting factors that may be applied to e1, e2, w1 and w2, respectively.

In this example, the trim circuit information 514 stored in the tag 512 may comprise one or more of the following: the trim model represented by equation (1), the Etest data, the wafer test data, an identifier, for example to identify the trim circuit 506 and distinguish it from other circuits on the substrate, and an identifier to enable the locating of information on the trim circuit 506 from a database.

When the test program is run it will result in an error, which is the difference between the predicted value R" and the optimal value for R' (labelled $R_{opt}'$) and may be represented as follows:

$$\delta R'' = R'' - R_{opt}' \quad (2)$$

$$\delta R'' = \Delta E1 \delta e1 + \Delta E2 \delta e2 + \ldots + \Delta W1 \delta w1 + \Delta W2 \delta w2 + \ldots \quad (3)$$

$\delta$ is used to denote errors of the associated variables. For example, $\delta e1$ is the error associated with e1. $\Delta E1$, $\Delta E2$, $\Delta W1$ and $\Delta W2$ are weighting factors that may be applied to $\delta e1$, $\delta e2$, $\delta w1$ and $\delta w2$, respectively.

By knowing R" and $\delta R$" for each tag or group of tags, the test program will then first test, R(0)=R", and then it's second test, R(1)=R"+$\delta R$", measuring i2 each time. The test program then uses the information associated with the tagged circuit to calculate its next predicted value, R(3), and so on. Once the proper value for i2 is obtained, the trim model for the tagged circuit may be updated based on the new information. Additionally, by tracking R(0), R(1), R(2), and so on over many units the optimum structure for the trim circuit 506 can be determined for the same or similar tagged trim circuits on future designs or, based on the tag or group of tags, the process may be adjusted to achieve faster convergence or better yield. In the present example, the equation (1) forms the trim model. Equations (2) and (3) describe a test program that may be used to update the trim model and to improve the accuracy of the trim model presented by equation (1). The test program may be part of the trim algorithm or may be a separate process used to update the trim model.

The models used for design simulation during the design process (steps 102 and 104) may be quite complicated and require significant computer resources in order to use them. These prior art models consider the entire process. However, using these prior art models real-time on the production tester (steps 108-114) isn't practical because of the computer resources required. Often it can take hours to run simulations using these models. Further, the traditional models used for design are often to inaccurate to properly predict production test results. Analysis has shown that some design models can be off by as much as 26-sigma.

During production testing (step 114), all the tests for a given device must be completed in no more than a few seconds. It turns out, that while many of the parameters associated with these models can vary greatly by design, only a few vary in a significant way from part to part on a wafer, from wafer to wafer in a lot, or from lot to lot during a production run.

The present disclosure may use tagged trim circuits with associated models that consider only parameters that directly impact these variations, since these are the variations that effect the optimum trim algorithms and trim results. The use of the tagged trim circuits therefore can speed up the testing procedure.

The prior art design model and the tagged design model of the present disclosure are different in the following ways:
1. The tagged design model may provide a matrix solution based on past events in the simulation timeline of the tagged circuit model being simulated. The proposed solution may provide only one result for the parameter of interest.
2. The tagged design model may be based on physical parameters that are used to predict electrical behaviour. The proposed solution may use other test results to predict the parameter of interest.
3. The tagged design model may be event based or uses time-based convergence to determine a result. The proposed solution may use a static function associated with the tag or group of tags to determine a predicted result for the parameter of interest.

A design model may be an exhaustive model of each of the characteristics of the circuit. These models are used by designers to predict the behaviour of the circuit.

It should be noted that tagged design model attributes could be used in conjunction with the proposed solution but are not essential.

For example, in each of the above cases:
1. The proposed solution could be used as an input to a tagged design model to predict outcomes that aren't tested.
2. The proposed solution could be used as an input along with physical parameters to predict another untested outcome.
3. The proposed solution could be used with either event based or time-based convergence approaches to predict a result under different conditions.

In turn, any of these results could be further used as an input to the tagged design model. The traditional process can be broken down into eight parts:
1. Identify a design specification. The design specification may describe required properties or values of the electrical circuit within a certain tolerance.
2. Design an electrical circuit according to a rough analysis based on requirements set out in the design specification
3. Simulate the electrical circuit to determine if it meets the requirements outlined in the design specification
4. Add a trim circuit to enable meeting the design specification
5. Fabricate the electrical circuit
6. Evaluate the electrical circuit on a small number of nominal devices and determine if they meet specification
7. Characterise the electrical circuit for split processes (3 or 6 sigma splits of various parameters to determine how the electrical circuit will work in extreme cases of the process)
8. Produce the electrical circuit (ramp up to large quantities of devices). This is the end point of the development process and results in the production of devices.

The proposed new process can be broken down into nine parts:
1. Identify a design specification. The design specification may describe required properties or values of the electrical circuit within a certain tolerance.
2. Design an electrical circuit according to a rough analysis based on requirements set out in the design specification
3. Simulate the electrical circuit to determine if it meets the requirements outlined in the design specification
4. Add a trim circuit to enable meeting the design specification
5. Assign a tag to the trim circuit or identify an existing tag that matches the trim circuit characteristics
6. Fabricate the electrical circuit and the tag
7. Evaluate the electrical circuit on a small number of nominal devices and determine if they meet specification
8. Characterise the electrical circuit for split processes (3 or 6 sigma splits of various parameters to determine how the electrical circuit will work in extreme cases of the process)

9. Produce the electrical circuit (ramp up to large quantities of devices). This is the end point of the development process and results in the production of devices.

Once the trim circuit is tagged, it may be continuously monitored to ensure it continues to match the characteristics of the tag and the model for the tag may be adjusted accordingly.

Using the proposed tagged design model can contribute significantly to test time reduction; it will be faster and less error prone because fewer codes must be tried. Some of the benefits of tagging are that it makes identifying the trim circuit and tracking it across multiple devices faster, simpler, easier, and more immediately available on the automatic test equipment (ATE). The tag may be permanent and easy to find by the test engineer. This is especially true if the tagged trim circuit is part of a library which in turn is part of an IP flow that uses it.

ATE is the test equipment used to test large numbers of devices during production. The test engineer may write a test program based on the trim algorithm that runs on the ATE.

Given the number of trims involved in any given circuit, often over one hundred; managing them can be a huge effort. Tracking changes and IP over time can be challenging. Even with software tracking systems designers often struggle to explain the relationship between their designs and other similar designs. Tagging the trim circuit and integrating that information physically in the silicon, the electronic package or a memory element can resolve this issue. Additional benefit is provided by the use of a trim model which may incorporate machine learning.

There are two compounding trends that are primarily driving the increased need for greater speed in the testing process for trim circuits. First is the falling cost of Deep Sub-Micron (DSM) processes. Second is the increasing performance of machine learning tools and the rapid expansion of machine learning technology. The complexity of circuitry and trimming requirements for devices such as PMIC devices and RF devices increases dramatically as a result of these trends. As DSM processes become less expensive and friendlier to analog/RF they may become increasing desirable for analog products. However, the challenge for these products is that the process variation for small circuits is very large. As a result, the necessity for trimming is likely to become more and more acute. The challenges of DSM performance demands will need to have complex analog solutions. These will be increasingly enabled by more complicated trim circuits. The tag procedure of the present disclosure can be used to speed up the process of setting the trim circuits such that their associated electrical circuits meet the required design specification.

Optimization of trim goals can be achieved through several processes that can be part of a holistic system. These may include tagging of trim circuitry, design improvement analysis, process improvement analysis, and test improvement analysis. These analyses may depend on tagging and the formulation of a trim model, which considers the tagging, to represent the known trim conditions at each step and, potentially, a unified model which represents the known trim conditions across all these different circumstances. Each of these elements contribute to the overall process through mutual interactions and feedback from later stages in mature products to earlier stages in devices under development. This type of approach gives the system a unique advantage to the prior art approach. Design analysis may include the selection of components for a given trim algorithm. Process analysis may incorporate elements of yield improvement and process optimization for matching the existing design. Test analysis may comprise the selection of algorithms and default values for production testing. The present disclosure provides techniques, methods, and apparatus that support meeting these goals and supporting each of the analysis steps individually and in the context of the entire system.

Using the methods described herein a test engineer may determine the trim value of a trim circuit in a quicker and therefore more cost-effective fashion than prior art methods allow, by reading a tag comprising functional circuit information and/or trim circuit information, that enables the test engineer to efficiently determine a suitable trim value for the trim circuit.

The methods disclosed herein can reduce test time and development time for electrical circuits comprising trim circuits.

Various improvements and modifications may be made to the above without departing from the scope of the disclosure.

What is claimed is:

1. A method of producing an apparatus comprising an electrical circuit that has one or more characteristics that meet a design specification, comprising:
   designing the electrical circuit comprising a trim circuit having a trim value that is variable, the, or each, characteristic of the electrical circuit being adjustable based on the trim value of the trim circuit;
   encoding functional circuit information and/or trim circuit information in a tag;
   producing the electrical circuit and the tag in the apparatus;
   reading the functional circuit information and/or the trim circuit information stored in the tag; and:
   determining the trim value for the trim circuit that results in the, or each, characteristic of the electrical circuit meeting the design specification using the functional circuit information and/or the trim circuit information; wherein:
   determining the trim value comprises applying a trim model.

2. The method of claim 1, wherein the trim circuit information comprises the trim model.

3. The method of claim 1, wherein applying the trim model comprises providing the functional circuit information and/or the trim circuit information to the trim model.

4. The method of claim 1, wherein the trim circuit information comprises an identifier for the trim circuit.

5. The method of claim 4, comprising:
   identifying the trim circuit by the identifier; wherein:
   determining the trim value comprises:
      i) accessing a database;
      ii) using the identifier to find database information on the trim circuit in the database; and:
      iii) determining the trim value using the database information.

6. The method of claim 5, wherein the database information comprises the trim model.

7. The method of claim 5, wherein applying the trim model comprises providing the database information to the trim model.

8. The method of claim 1, wherein determining the trim value comprises providing the trim value as an output from the trim model.

9. The method of claim 1, wherein determining the trim value comprises applying a trim algorithm.

10. The method of claim 9, wherein the trim algorithm is applied by automated test equipment.

11. The method of claim 9, wherein determining the trim value comprises:
    providing a default trim setting as an output from the trim model; and
    using the default trim setting as a starting trim value for the trim circuit in application of the trim algorithm, an output of the trim algorithm being the trim value.

12. The method of claim 9, comprising selecting the trim algorithm that is applied based on an output of the trim model, an output of the trim algorithm being the trim value.

13. The method of claim 9, comprising setting one or more parameters of the trim algorithm based on an output of the trim model, an output of the trim algorithm being the trim value.

14. The method of claim 1, wherein designing the electrical circuit comprises generating a design file using circuit design software.

15. The method of claim 14, wherein prior to fabricating the electrical circuit, the design file is passed to a fabrication database comprising information on how to fabricate the electrical circuit.

16. The method of claim 14, wherein the functional circuit information and/or the trim circuit information comprises at least a portion of the design file.

17. The method of claim 1, comprising setting the trim value of the trim circuit to the trim value, as determined.

18. The method of claim 1, wherein producing the tag comprises fabricating the tag in a first substrate.

19. The method of claim 18, wherein producing the electrical circuit comprises fabricating the electrical circuit in the first substrate or a second substrate.

20. The method of claim 1, wherein producing the tag comprises marking a first electronic package with the tag.

21. The method of claim 20, wherein producing the electrical circuit comprises:
    fabricating the electrical circuit in a first substrate; and:
    packaging the first substrate in the first electronic package or packaging the first substrate in a second electronic package.

22. The method of claim 1, wherein producing the tag comprises storing the tag in a memory element.

23. The method of claim 22, comprising fabricating the memory element in a first substrate prior to storing the tag in the memory element.

24. The method of claim 23, comprising producing the electrical circuit comprises fabricating the electrical circuit in the first substrate or fabricating the electrical circuit in a second substrate.

25. The method of claim 1 comprising updating the functional circuit information and/or the trim circuit information stored in the tag.

26. The method of claim 25, wherein the functional circuit information and/or the trim circuit information stored in the tag is updated using data determined from wafer acceptance test results.

27. An apparatus comprising:
    a first electrical circuit that has one or more characteristics, the first electrical circuit comprising a first trim circuit having a first trim value that is variable, the, or each, characteristic of the first electrical circuit being adjustable based on the first trim value of the first trim circuit; and
    a first tag comprising first functional circuit information and/or first trim circuit information, the first functional circuit information and/or the first trim circuit information being encoded in the first tag; wherein:
    the first functional circuit information and/or the first trim circuit information stored in the first tag is configured to be readable; and:
    the first functional circuit information and/or the first trim circuit information is suitable for determining the first trim value for the first trim circuit that results in the, or each, characteristics of the first electrical circuit meeting a first design specification; and:
    determining the first trim value comprises applying a first trim model.

* * * * *